United States Patent
Liu et al.

(10) Patent No.: US 11,120,101 B2
(45) Date of Patent: Sep. 14, 2021

(54) MATRIX MULTIPLICATION SYSTEM AND METHOD

(71) Applicant: Arm Limited, Cambridge (GB)

(72) Inventors: Zhi-Gang Liu, Westford, MA (US); Matthew Mattina, Boylston, MA (US); Paul Nicholas Whatmough, Cambridge, MA (US)

(73) Assignee: Arm Limited, Cambridge (GB)

( * ) Notice: Subject to any disclaimer, the term of this patent is extended or adjusted under 35 U.S.C. 154(b) by 118 days.

(21) Appl. No.: 16/585,265

(22) Filed: Sep. 27, 2019

(65) Prior Publication Data

US 2021/0097130 A1    Apr. 1, 2021

(51) Int. Cl.
*G06F 17/16*      (2006.01)
*H03M 7/30*      (2006.01)

(52) U.S. Cl.
CPC .............. *G06F 17/16* (2013.01); *H03M 7/30* (2013.01)

(58) Field of Classification Search
CPC ................................. G06F 17/16; H03M 7/30
USPC ........................................................ 708/203
See application file for complete search history.

(56) References Cited

U.S. PATENT DOCUMENTS

| 2013/0073599 | A1* | 3/2013 | Maloney | G06F 9/3001 708/514 |
| 2019/0115933 | A1* | 4/2019 | Chen | G06F 7/5443 |
| 2019/0188899 | A1* | 6/2019 | Moloney | G01C 21/30 |

OTHER PUBLICATIONS

Buluc et al., "Parallel Sparse Matrix-Vector and Matrix-Transpose-Vector Multiplication Using Compressed Sparse Blocks," SPAA '09 Proceedings of the twenty-first annual symposium on Parallelism in algorithms and architectures, 2009, pp. 233-244.

(Continued)

*Primary Examiner* — Tan V Mai
(74) *Attorney, Agent, or Firm* — Leveque IP Law, P.C.

(57) ABSTRACT

The present disclosure advantageously provides a system method for efficiently multiplying matrices with elements that have a value of 0. A bitmap is generated for each matrix. Each bitmap includes a bit position for each matrix element. The value of each bit is set to 0 when the value of the corresponding matrix element is 0, and to 1 when the value of the corresponding matrix element is not 0. Each matrix is compressed into a compressed matrix, which will have fewer elements with a value of 0 than the original matrix. Each bitmap is then adjusted based on the corresponding compressed matrix. The compressed matrices are then multiplied to generate an output matrix. For each element i,j in the output matrix, a dot product of the $i^{th}$ row of the first compressed matrix and the $j^{th}$ column of the second compressed matrix is calculated based on the bitmaps.

19 Claims, 14 Drawing Sheets

(56) References Cited

OTHER PUBLICATIONS

Jouppi et al., "In-Datacenter Performance Analysis of a Tensor Processing Unit," 44th International Symposium on Computer Architecture (ISCA), Toronto, Canada, Jun. 24-28, 2017.
Moons et al., "A 0.3-2.6 TOPS/W Precision-Scalable Processor for Real-Time Large-Scale ConvNets," IEEE Symposium on VLSI Circuits, Jun. 16, 2016, Honolulu, HI, US.
Parashar et al., "SCNN: An Accelerator for Compressed-sparse Convolutional Neural Networks," arXiv:1708.04485v1 [cs.Ne] May 23, 2017.
Y. Chen, J. Emer and V. Sze, "Eyeriss: A Spatial Architecture for Energy-Efficient Dataflow for Convolutional Neural Networks," 2016 ACM/IEEE 43rd Annual International Symposium on Computer Architecture (ISCA), Seoul, 2016, pp. 367-379.

* cited by examiner

FIG. 2

MATRIX MULTIPLICATION SYSTEM AND METHOD

BACKGROUND

The present disclosure relates to computer systems. More particularly, the present disclosure relates to a matrix multiplication system and method.

Matrix multiplication is a fundamental component for many important applications, including machine learning (ML), artificial neural networks (ANNs), convolutional neural networks (CNNs), etc. Generally, matrices may be classified as either sparse or dense. Most elements of a sparse matrix have a value of zero, while most elements of a dense matrix have a non-zero value. For the simple matrix multiplication operation C=A×B, when matrix A or matrix B is sparse, most of the matrix calculations will include a value of zero for at least one of the operands. When both matrix A and matrix B are sparse, an even greater number of matrix calculations will include a value of zero for at least one of the operands. Since multiplication by an operand that has a value of zero will always result in a product that has a value of zero, applying standard matrix multiplication techniques to sparse matrices is very inefficient due to the large number of operands that have a value of zero.

BRIEF DESCRIPTION OF THE DRAWINGS

FIG. 2 depicts multiplication of two matrices to generate an output matrix, in accordance with an embodiment of the present disclosure.

DETAILED DESCRIPTION

Figure 1A:
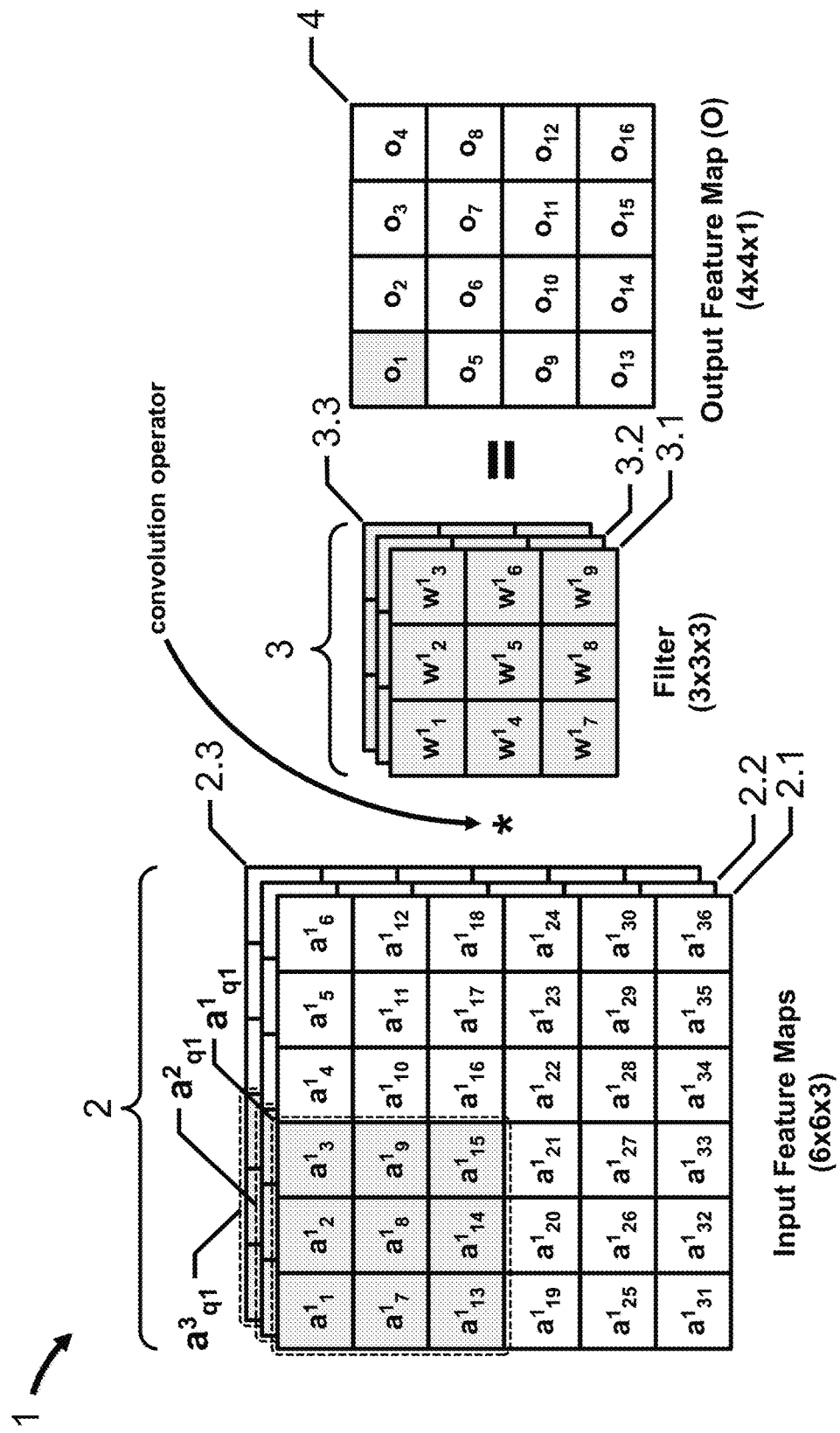
FIG. 1A depicts convolutional layer calculation for a CNN, in accordance with an embodiment of the present disclosure.

Embodiments of the present disclosure will now be described with reference to the drawing figures, in which like reference numerals refer to like parts throughout.

Embodiments of the present disclosure advantageously provide a system and method for efficiently multiplying matrices with elements that have a value of zero.

In one embodiment, a bitmap is generated for each matrix. Each bitmap includes a bit position for each matrix element. The value of each bit is set to 0 when the value of the corresponding matrix element is 0, and to 1 when the value of the corresponding matrix element is not 0. Each matrix is compressed into a compressed matrix, which will have fewer elements with a value of 0 than the original matrix. Each bitmap is then adjusted based on the corresponding compressed matrix.

The compressed matrices are then multiplied, using a computer-based method, coprocessor, hardware accelerator, etc., to generate an output matrix. For each element i,j in the output matrix, a dot product of the $i^{th}$ row of the first compressed matrix and the $j^{th}$ column of the second compressed matrix is calculated based on the bitmaps.

More particularly, when the bit position in the bitmap corresponding to an element i,k of the $i^{th}$ row of the first compressed matrix has the value of 1 and when the bit position in the bitmap corresponding to an element k,j of the $j^{th}$ column of the second compressed matrix has the value of 1, the element i,k and the element k,j are multiplied to generate an intermediate product. When the bit position in the first bitmap corresponding to an element i,k of the $i^{th}$ row of the first compressed matrix has a value of 0 or when the bit position in the second bitmap corresponding to an element k,j of the $j^{th}$ column of the second compressed matrix has the value of 0, the element i,k and the element k,j are not multiplied, thereby reducing processor load, power consumption, etc. The intermediate products are then accumulated to generate the element i,j of the output matrix. The upper limit for the index k is determined by the amount of compression applied to the matrices.

In some embodiments, the compressed matrices will only include elements that have non-zero values. In other embodiments, the compressed matrices will include one or more elements that have a value of 0 in order to maintain compatible dimensions for the multiplication operation. Any elements within the compressed matrices that have a value of 0 are treated as non-zero elements, and will have their respective bit values adjusted to 1 in the corresponding bitmaps. Even though the compressed matrices may include elements that have a value of 0, these elements only minimally effect the overall advantages provided by the present disclosure.

Matrix multiplication is used extensively by ANNs. An ANN models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A deep neural network (DNN) has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tanh function, a rectified linear unit (ReLu) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation signal value that is provided to the activation function for that node. The output of the activation function is then provided as an input data value to each output layer node. At each output layer node, the output data value received from each hidden layer node is multiplied by a respective connection weight, and the resulting products are summed or accumulated into an activation signal value that is provided to the activation function for that node. The output of the activation function is then provided as output data. Additional hidden layers may be similarly configured to process data.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

A multi-layer perceptron (MLP) is a fully-connected ANN that has an input layer, an output layer and one or more hidden layers, and uses a non-linear activation function to classify data that is not linearly separable. MLPs may be used for natural language processing applications, such as machine translation, speech recognition, etc. A CNN is a variation of an MLP that has an input layer, an output layer and multiple hidden layers, including a series of convolutional layers, followed by pooling layers, fully-connected layers, and normalization layers. Each convolutional layer applies a sliding dot product or cross-correlation to the input data, and then passes the results to the next layer. CNNs may be used for classification or recognition applications, such as image recognition, speech recognition, etc. Other ANNs include recursive neural networks (RNNs), long short-term memories (LSTMs), sequence-to-sequence models that include an encoder RNN and a decoder RNN, shallow neural networks, etc.

FIG. 1A depicts convolutional layer calculation 1 for a CNN, in accordance with an embodiment of the present disclosure.

Input feature maps 2 (6×6×3) includes input data matrix 2.1, input data matrix 2.2 and input data matrix 2.3, filter 3 (3×3×3) includes weight matrix 3.1 ($w^1$), weight matrix 3.1 ($w^2$), and weight matrix 3.1 ($w^3$), and output feature map 4 (4×4×1) includes an output data matrix. Filter 3 is convolved with input feature maps 2 to produce output feature map 4. In this example, the output data matrix element $o_1$ is the sum of the dot products of filter 3.1 ($w^1$) and the upper left quadrant of input data matrix 2.1 ($a^1_{q1}$), filter 3.2 ($w^2$) and the upper left quadrant of input data matrix 2.2 ($a^2_{q1}$), and filter 3.3 ($w^3$) and the upper left quadrant of input data matrix 2.3 ($a^3_{q1}$).

More particularly, the dot product of filter 3.1 ($w^1$) and the upper left quadrant of input data matrix 2.1 ($a^1_{q1}$) is equal to $a^1_1 \times w^1_1 + a^1_2 \times w^1_2 + a^1_3 \times w^1_3 + a^1_7 \times w^1_4 + a^1_8 \times w^1_5 + a^1_9 \times w^1_6 + a^1_{13} \times w^1_7 + a^1_{14} \times w^1_8 + a^1_{15} \times w^1_9$. The dot products of filter 3.2 ($w^2$) and the upper left quadrant of input data matrix 2.2 ($a^2_{q1}$), and filter 3.3 ($w^3$) and the upper left quadrant of input data matrix 2.3 ($a^3_{q1}$) are calculated in the same manner, i.e., the dot product of filter 3.2 ($w^2$) and the upper left quadrant of input data matrix 2.2 ($a^2_{q1}$) is equal to $a^2_1 \times w^2_1 + a^2_2 \times w^2_2 + a^2_3 \times w^2_3 + a^2_7 \times w^2_4 + a^2_8 \times w^2_5 + a^2_9 \times w^2_6 + a^2_{13} \times w^2_7 + a^2_{14} \times w^2_8 + a^2_{15} \times w^2_9$, and the dot product of filter 3.3 ($w^3$) and the upper left quadrant of input data matrix 2.3 ($a^3_{q1}$) is equal to $a^3_1 \times w^3_1 + a^3_2 \times w^3_2 + a^3_3 \times w^3_3 + a^3_7 \times w^3_4 + a^3_8 \times w^3_5 + a^3_9 \times w^3_6 + a^3_{13} \times w^3_7 + a^3_{14} \times w^3_8 + a^3_{15} \times w^3_9$.

Output data matrix element $o_2$ is the sum of the dot products of filter 3.1 ($w^1$) and the next upper quadrant of input data matrix 2.1, filter 3.2 ($w^2$) and the next upper quadrant of input data matrix 2.2, and filter 3.3 ($w^3$) and the next upper quadrant of input data matrix 2.3. The "next" upper quadrant in each input data matrix 2.1, 2.2 and 2.3 has been shifted one column to the right relative to the first upper quadrant. More particularly, the dot product of filter 3.1 ($w^1$) and the next upper quadrant of input data matrix 2.1 is equal to $a^1_2 \times w^1_1 + a^1_3 \times w^1_2 + a^1_4 \times w^1_3 + a^1_8 \times w^1_4 + a^1_9 \times w^1_5 + a^1_{10} \times w^1_6 + a^1_{14} \times w^1_7 + a^1_{15} \times w^1_8 + a^1_{16} \times w^1_9$. The dot products of filter 3.2 ($w^2$) and the next upper quadrant of input data matrix 2.2, and filter 3.3 ($w^3$) and the next upper quadrant of input data matrix 2.3 are calculated in the same manner, i.e., the dot product of filter 3.2 ($w^2$) and the next upper quadrant of input data matrix 2.2 is equal to $a^2_2 \times w^2_1 + a^2_3 \times w^2_2 + a^2_4 \times w^2_3 + a^2_8 \times w^2_4 + a^2_9 \times w^2_5 + a^2_{10} \times w^2_6 + a^2_{14} \times w^2_7 + a^2_{15} \times w^2_8 + a^2_{16} \times w^2_9$, and the dot product of filter 3.3 ($w^3$) and the next upper quadrant of input data matrix 2.3 is equal to $a^3_2 \times w^3_1 + a^3_3 \times w^3_2 + a^3_4 \times w^3_3 + a^3_8 \times w^3_4 + a^3_9 \times w^3_5 + a^3_{10} \times w^3_6 + a^3_{14} \times w^3_7 + a^3_{15} \times w^3_8 + a^3_{16} \times w^3_9$.

Figure 1B:
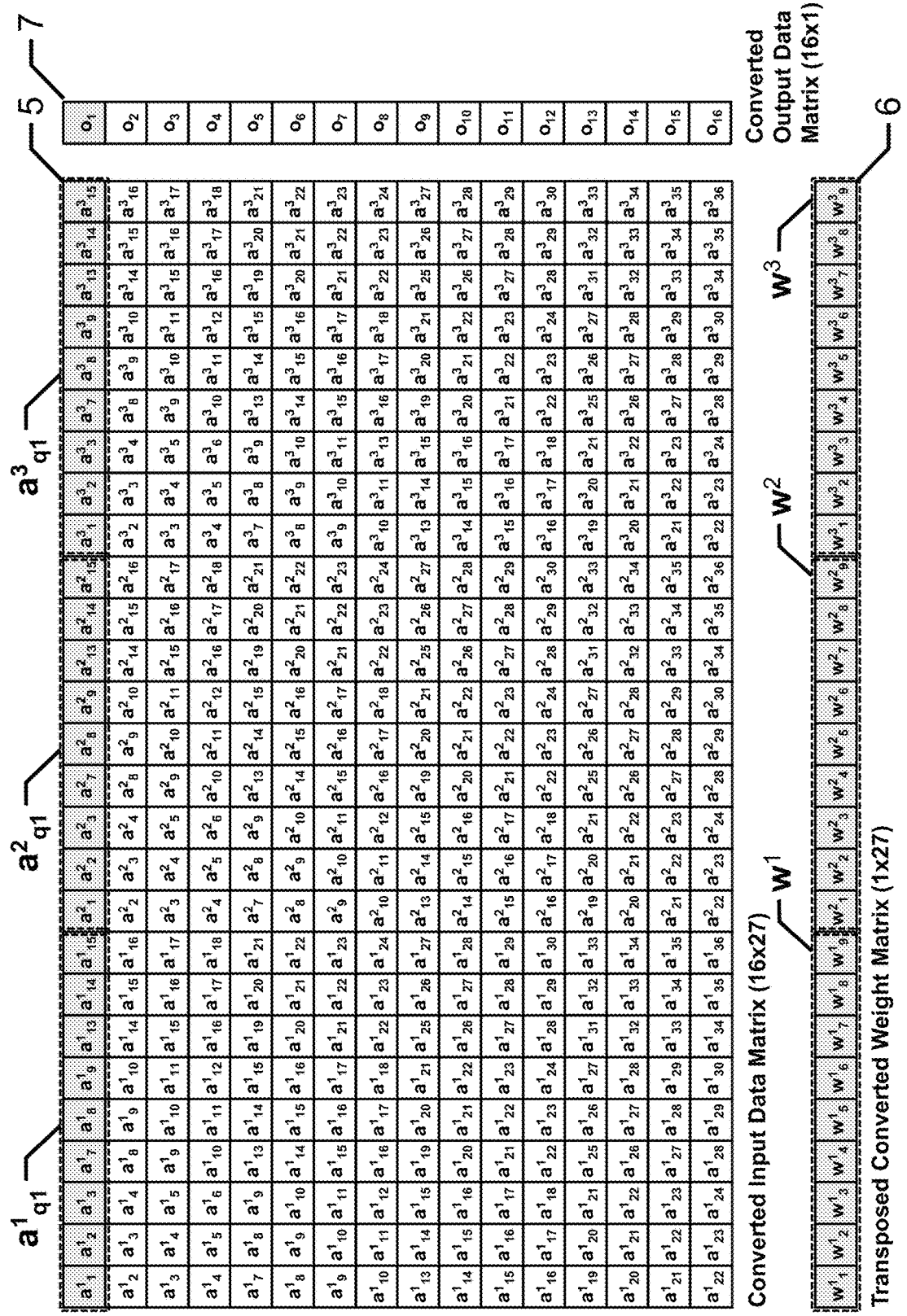
FIG. 1B depicts a converted convolutional layer calculation for a CNN, in accordance with an embodiment of the present disclosure.

FIG. 1B depicts a converted convolutional layer calculation for a CNN, in accordance with an embodiment of the present disclosure.

In one embodiment, the convolutional layer calculations for CNNs executing on central processor units (CPUs) may be converted into generic matrix multiplication (GEMM) operations, which may leverage GEMM-optimized software libraries. Convolution layer calculation 1 is converted into a GEMM operation by converting input feature maps 2 into converted input data matrix 5 (16×27) and filter 3 into converted weight matrix 6 (27×1). After multiplying converted input data matrix 5 and converted weight matrix 6, converted output data matrix 7 (16×1) is then reformed into output feature map 4 (4×4). For ease of illustration, converted weight matrix 6 (27×1) is depicted in a transposed orientation (1×27) in FIG. 1B.

In this example, converted output data matrix element $o_1$ is the sum of the dot products of the first row of converted input data matrix 5 and the first (i.e., only) column of converted weight matrix 6. As shown in FIG. 1B, the first row of converted input data matrix 5 includes the elements of the upper left quadrant of input data matrix 2.1 ($a^1_{q1}$), the upper left quadrant of input data matrix 2.2 ($a^2_{q1}$), and the upper left quadrant of input data matrix 2.3 ($a^3_{q1}$), while the converted weight matrix 6 includes filter 3.1 ($w^1$), filter 3.2 ($w^2$), and filter 3.3 ($w^3$).

More particularly, the converted output data matrix element $o_1$ is equal to $a^1_1 \times w^1_1 + a^1_2 \times w^1_2 + a^1_3 \times w^1_3 + a^1_7 \times w^1_4 + a^1_8 \times w^1_5 + a^1_9 \times w^1_6 + a^1_{13} \times w^1_7 + a^1_{14} \times w^1_8 + a^1_{15} \times w^1_9 + a^2_1 \times$ $w^2{}_1 + a^2{}_2 \times w^2{}_2 + a^2{}_3 \times w^2{}_3 + a^2{}_7 \times w^2{}_4 + a^2{}_8 \times w^2{}_5 + a^2{}_9 \times w^2{}_6 + a^2{}_{13} \times w^2{}_7 + a^2{}_{14} \times w^2{}_8 + a^2{}_{15} \times w^2{}_9 + a^3{}_1 \times w^3{}_1 + a^3{}_2 \times w^3{}_2 + a^3{}_3 \times w^3{}_3 + a^3{}_7 \times w^3{}_4 + a^3{}_8 \times w^3{}_5 + a^3{}_9 \times w^3{}_6 + a^3{}_{13} \times w^3{}_7 + a^3{}_{14} \times w^3{}_8 + a^3{}_{15} \times w^3{}_9$. As shown above, the converted output data matrix element $o_1$ is equal to the output data matrix element $o_1$.

Unfortunately, for CNNs executing on CPUs or other coprocessors, GEMM operations consume a significant number of processor cycles due to the large number of multiplications that are required. For example, one known image recognition CNN requires 3 giga operations per second (GOPS) per input data frame. Compounding this problem, many of the matrices upon which the GEMM operations are performed are sparse, which produces a very inefficient use of processing resources. Conversely, if GEMM operations could significantly reduce "multiply by zero" conditions, processing and power requirements could be significantly reduced. Known approaches that attempt to reduce "multiply by zero" conditions complicate the GEMM operations and introduce significant processing overhead on the CPU.

Figure 2:
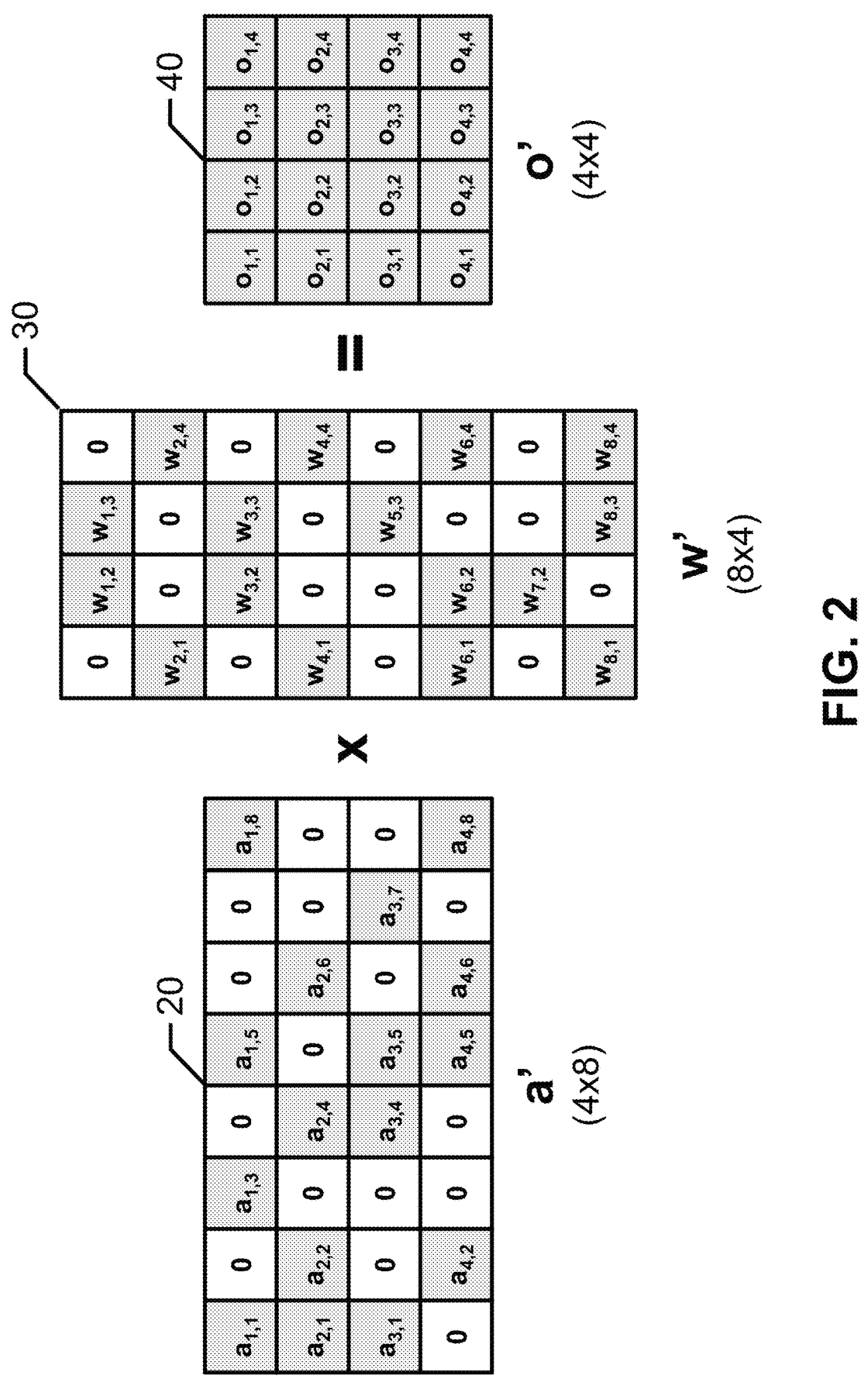

FIG. 2 depicts multiplication of two matrices to generate an output matrix, in accordance with an embodiment of the present disclosure.

In this embodiment, matrix 20 (4×8), labeled "a'," is multiplied with matrix 30 (8×4), labeled "w'," to produce output matrix 40 (4×4), labeled "o'." With respect to FIG. 1B, matrix 20 may represent a version of a converted input data matrix, matrix 30 may represent a version of a converted weight matrix, and output matrix 40 may represent a version of a converted output data matrix. For the purpose of illustration, 50% of the elements of matrix 20 have a value of zero (white blocks), while 50% of the elements of matrix 20 have a value that is not zero (shaded blocks). Similarly, 50% of the elements of matrix 30 have a value of zero (white blocks), while 50% of the elements of matrix 30 have a value that is not zero (shaded blocks). Due to the arrangement of the zero elements in matrices 20 and 30, 100% of the elements of output matrix 40 have a value that is not zero. Matrices 20 and 30 may be considered to be either sparse matrices or dense matrices, depending on convention.

Embodiments of the present disclosure advantageously provide a system and method for multiplying matrices that significantly reduce "multiply by zero" conditions. Importantly, while the principles and advantages provided by the present disclosure are most applicable to the multiplication of sparse matrices, the principles and advantages provided by the present disclosure remain very applicable to the multiplication of a sparse matrix with a dense matrix, as well as to the multiplication of two dense matrices.

For example, multiplication of a "sparse" matrix with 51% of its elements having a value of zero with a "dense" matrix with 49% of its elements having a value of zero derive nearly as much benefit from the principles and advantages provided by the present disclosure as two "sparse" matrices with 51% of their respective elements having a value that is zero. Similarly, two matrices with 49% of their respective elements having a value that is zero are considered "dense" matrices, but derive nearly as much benefit from the principles and advantages provided by the present disclosure as two "sparse" matrices with 51% of their respective elements having a value that is zero.

Figure 3:
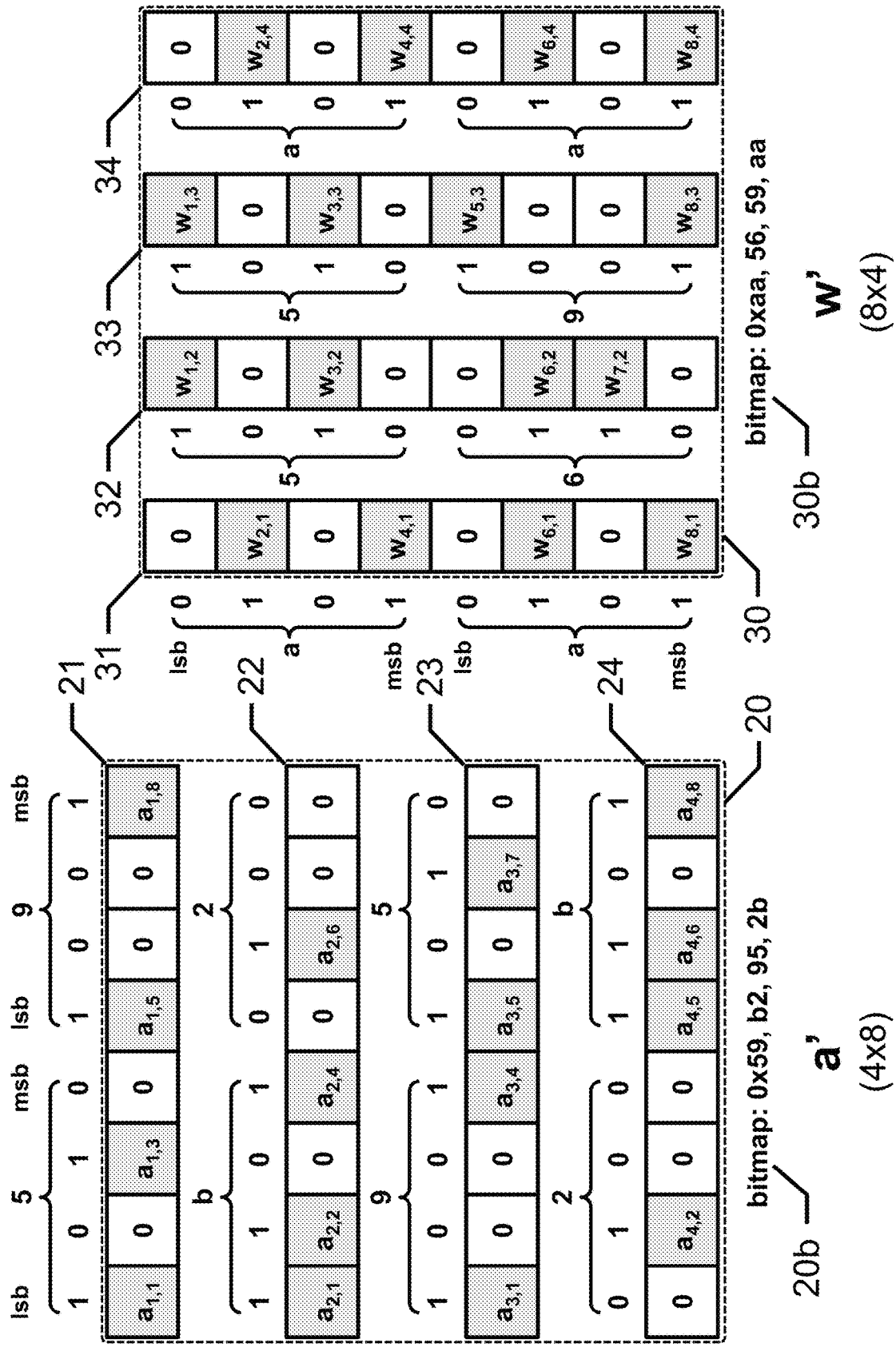
FIG. 3 depicts a matrix bitmap generation process, in accordance with an embodiment of the present disclosure.

FIG. 3 depicts a matrix bitmap generation process, in accordance with an embodiment of the present disclosure.

Matrix 20 includes four rows, i.e., row 21, row 22, row 23 and row 24. Each row includes four elements having a value of zero, and four elements having a non-zero value. Row 21 includes non-zero elements $a_{1,1}$, $a_{1,3}$, $a_{1,5}$ and $a_{1,8}$. Row 22 includes non-zero elements $a_{2,1}$, $a_{2,2}$, $a_{2,4}$ and $a_{2,6}$. Row 23 includes non-zero elements $a_{3,1}$, $a_{3,4}$, $a_{3,5}$ and $a_{3,7}$. Row 24 includes non-zero elements $a_{4,2}$, $a_{4,5}$, $a_{4,6}$ and $a_{4,8}$.

The bit values for each element of matrix 20 are depicted above each row, in binary and hexadecimal formats. The bit values for each row are formed into nibbles, with the least significant bit (lsb) being the left-most bit, and the most significant bit (msb) being the right-most bit. The first nibble (i.e., 4 bits) for row 21 has a value of "1011" or 0x5, and the second nibble for row 21 has a value of "1001" or 0x9; the byte value for row 21 is "10111001" or 0x59. The first nibble for row 22 has a value of "1101" or p0xb, and the second nibble for row 22 has a value of "0100" or 0x2; the byte value for row 22 is "11010100" or 0xb2. The first nibble for row 23 has a value of "1001" or 0x9, and the second nibble for row 23 has a value of "1010" or 0x5; the byte value for row 23 is "10011010" or 0x95. The first nibble for row 24 has a value of "0100" or 0x2, and the second nibble for row 24 has a value of "1101" or 0xb; the byte value for row 24 is "01001101" or 0x2b. The value for bitmap 20b is 0x59b2952b, which includes 32 bits (4 bytes, 8 nibbles).

Matrix 30 includes four columns, i.e., column 31, column 32, column 33 and column 34. Each column includes four elements having a value of zero, and four elements having a non-zero value. Column 31 includes non-zero elements $w_{2,1}$, $w_{4,1}$, $w_{6,1}$ and $w_{8,1}$. Column 32 includes non-zero elements $w_{1,2}$, $w_{3,2}$, $w_{6,2}$ and $w_{7,2}$. Column 33 includes non-zero elements $w_{1,3}$, $w_{3,3}$, $w_{5,3}$ and $w_{8,3}$. Column 34 includes non-zero elements $w_{2,4}$, $w_{4,4}$, $w_{6,4}$ and $w_{8,4}$.

The bit values for each element of matrix 30 are depicted beside each column, in binary and hexadecimal formats. The bit values for each column are formed into nibbles, with the least significant bit (lsb) being the top-most bit, and the most significant bit (msb) being the bottom-most bit. The first nibble (i.e., 4 bits) for column 31 has a value of "0101" or 0a, and the second nibble for column 31 has a value of "0101" or 0a; the byte value for column 31 is "01010101" or 0xaa. The first nibble for column 32 has a value of "1010" or 0x5, and the second nibble for column 32 has a value of "0110" or 0x6; the byte value for column 32 is "10100110" or 0x56. The first nibble for column 33 has a value of "1010" or 0x5, and the second nibble for column 33 has a value of "1001" or 0x9; the byte value for column 33 is "10101001" or 0x59. The first nibble for column 34 has a value of "0101" or 0xaa, and the second nibble for column 34 has a value of "0101" or 0xaa; the byte value for column 34 is "01010101" or 0xaa. The value for bitmap 30b is 0xaa5659aa, which includes 32 bits (4 bytes, 8 nibbles).

Figure 4:
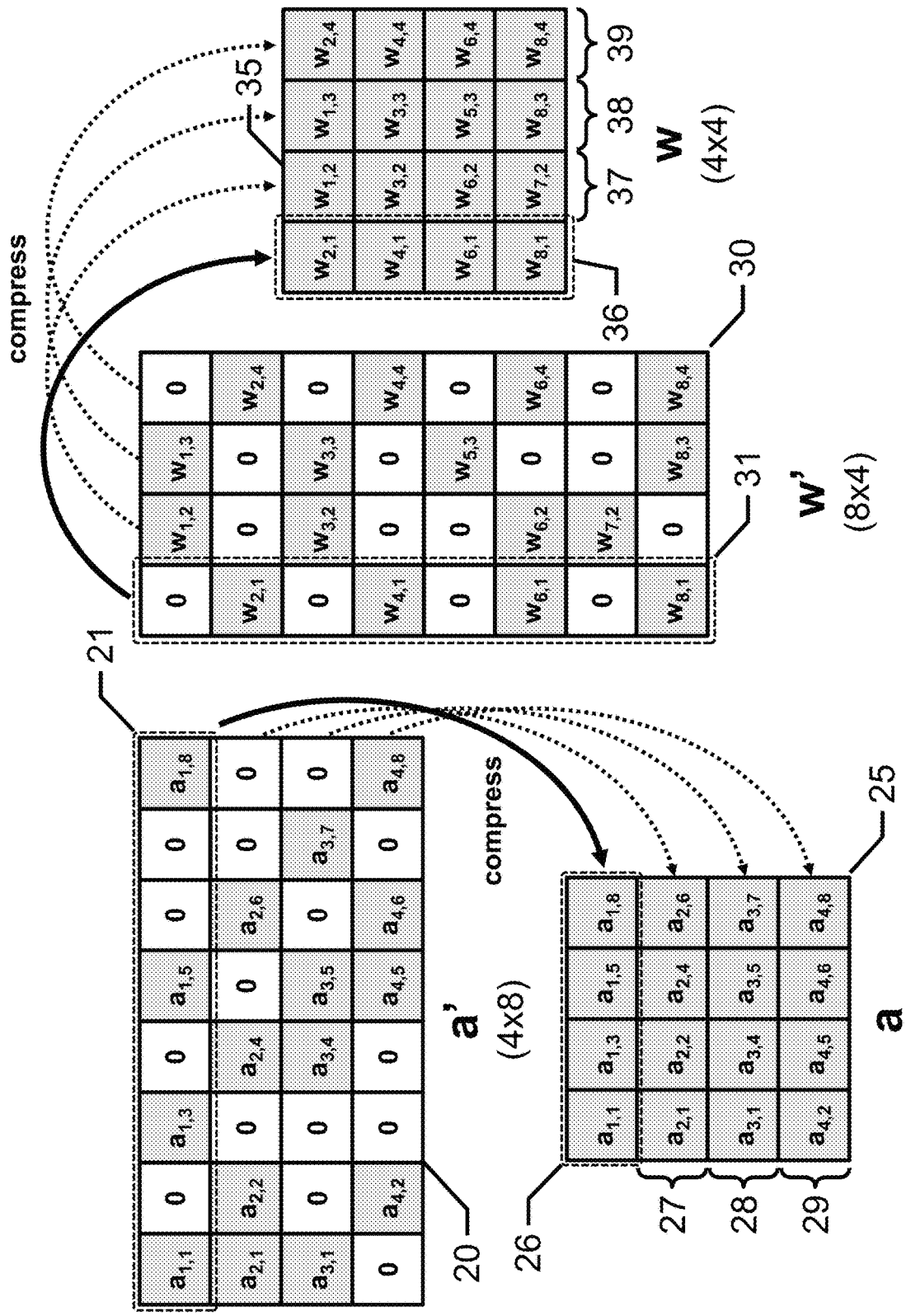
FIG. 4 depicts a matrix compression process, in accordance with an embodiment of the present disclosure.

FIG. 4 depicts a matrix compression process, in accordance with an embodiment of the present disclosure.

The dimensions of matrices 25 and 35 are determined based on the minimum number of zero-valued elements in each row of matrix 20 and the minimum number of zero-valued elements in each column of matrix 30. Generally, the row of matrix 20 or the column of matrix 30 with the least number of zero-valued elements determines the maximum amount of compression available for matrices 20 and 30. In alternative embodiments, elements of matrices 20 and 30 having a value above or below a predetermined threshold, outside a predetermined value range, etc., may be set to zero in order to increase the maximum amount of compression.

In this embodiment, rows 21, 22, 23 and 24 each have four zero-valued elements, and columns 31, 32, 33 and 34 each have four zero-valued elements, so the maximum amount of compression is 4 elements per row or column. Matrix 20 may be compressed from a 4×8 matrix to a 4×4 matrix, and matrix 30 may be compressed from an 8×4 matrix to a 4×4 matrix, as depicted in FIG. 4.

In another embodiment, row 21 has two zero-valued elements, column 31 has three zero-valued elements, rows 22, 23 and 24 have four zero-valued elements, and columns 32, 33 and 34 have four zero-valued elements. In this embodiment, the maximum amount of compression is 2 elements. Matrix 20 may be compressed from a 4×8 matrix to a 4×6 matrix, and matrix 30 may be compressed from an 8×4 matrix to a 6×4 matrix. Compressed matrix 25 will include zero-valued elements in rows 27, 28 and 29, and compressed matrix 35 will include at least one zero-valued element in all four columns, resulting in some degree of inefficiency. For extremely sparse matrices, matrix 20 may be compressed to a 4×1 matrix, and matrix 30 may be compressed to a 1×4 matrix, resulting in at least an eight-fold reduction of multiplication and accumulation operations. In all these embodiments, the output matrix will always be a 4×4 matrix. Other matrix dimensions are also contemplated.

In this embodiment, matrix 20 is compressed into matrix 25 in a row-wise manner. The non-zero value elements of row 21 form compressed row 26 of matrix 25, i.e., $a_{1,1}$, $a_{1,3}$, $a_{1,5}$ and $a_{1,8}$, in the same order. The non-zero value elements of row 22 form compressed row 27 of matrix 25, i.e., $a_{2,1}$, $a_{2,2}$, $a_{2,4}$ and $a_{2,6}$, in the same order. The non-zero value elements of row 23 form compressed row 28 of matrix 25, i.e., $a_{3,1}$, $a_{3,4}$, $a_{3,5}$ and $a_{3,7}$, in the same order. The non-zero value elements of row 24 form compressed row 29 of matrix 25, i.e., $a_{4,2}$, $a_{4,5}$, $a_{4,6}$ and $a_{4,8}$, in the same order.

In this embodiment, matrix 30 is compressed into matrix 35 in a column-wise manner. The non-zero value elements of column 31 form compressed column 36 of matrix 35, i.e., $w_{2,1}$, $w_{4,1}$, $w_{6,1}$ and $w_{8,1}$, in the same order. The non-zero value elements of column 32 form compressed column 37 of matrix 35, i.e., $w_{1,2}$, $w_{3,2}$, $w_{6,2}$ and $w_{7,2}$, in the same order. The non-zero value elements of column 33 form compressed column 38 of matrix 35, i.e., $w_{1,3}$, $w_{3,3}$, $w_{5,3}$ and $w_{8,3}$, in the same order. The non-zero value elements of column 34 form compressed column 39 of matrix 35, i.e., $w_{2,4}$, $w_{4,4}$, $w_{6,4}$ and $w_{8,4}$, in the same order.

Figure 5A:
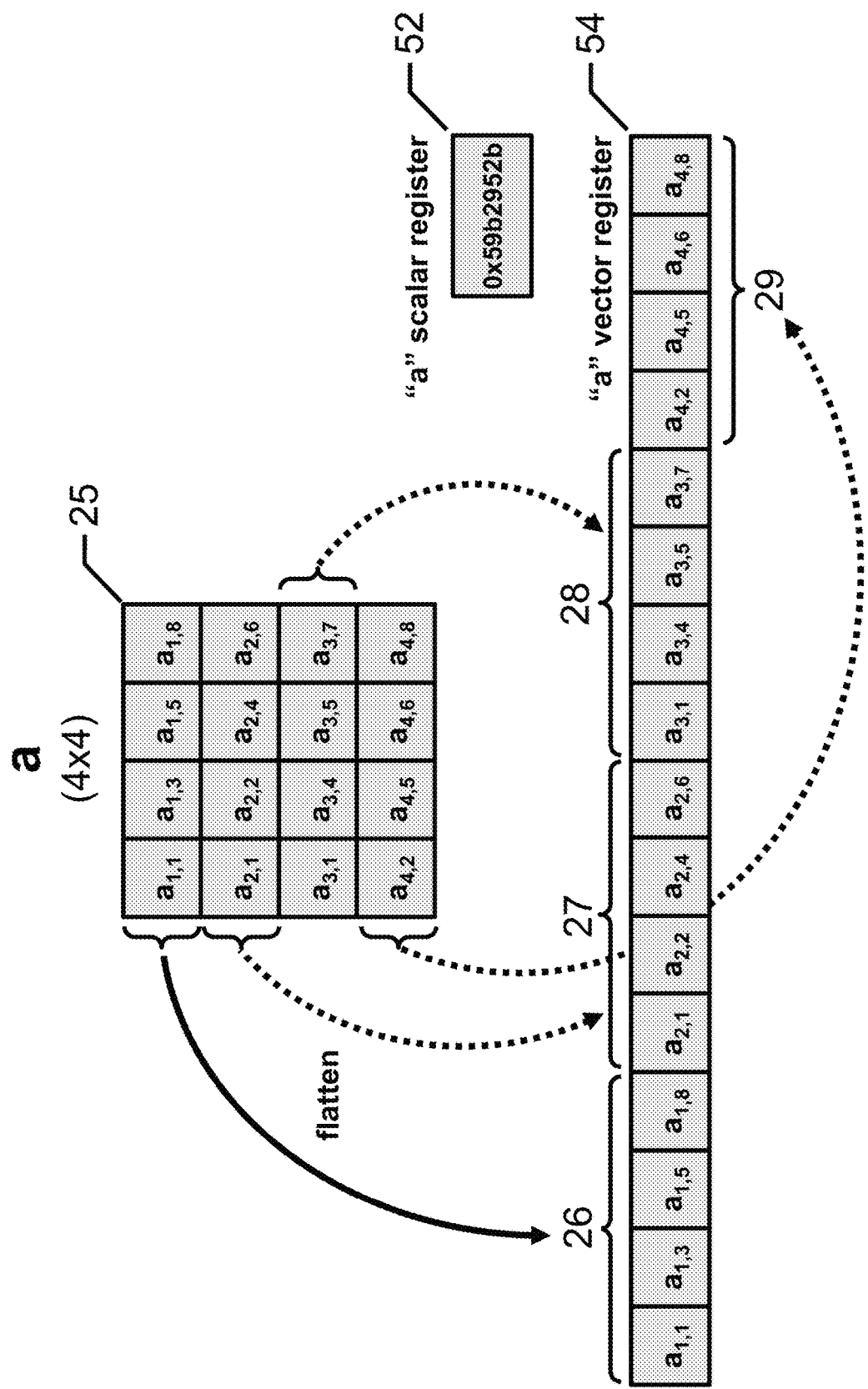
FIGS. 5A and 5B depict compressed matrix flattening processes, in accordance with an embodiment of the present disclosure.
Figure 5B:
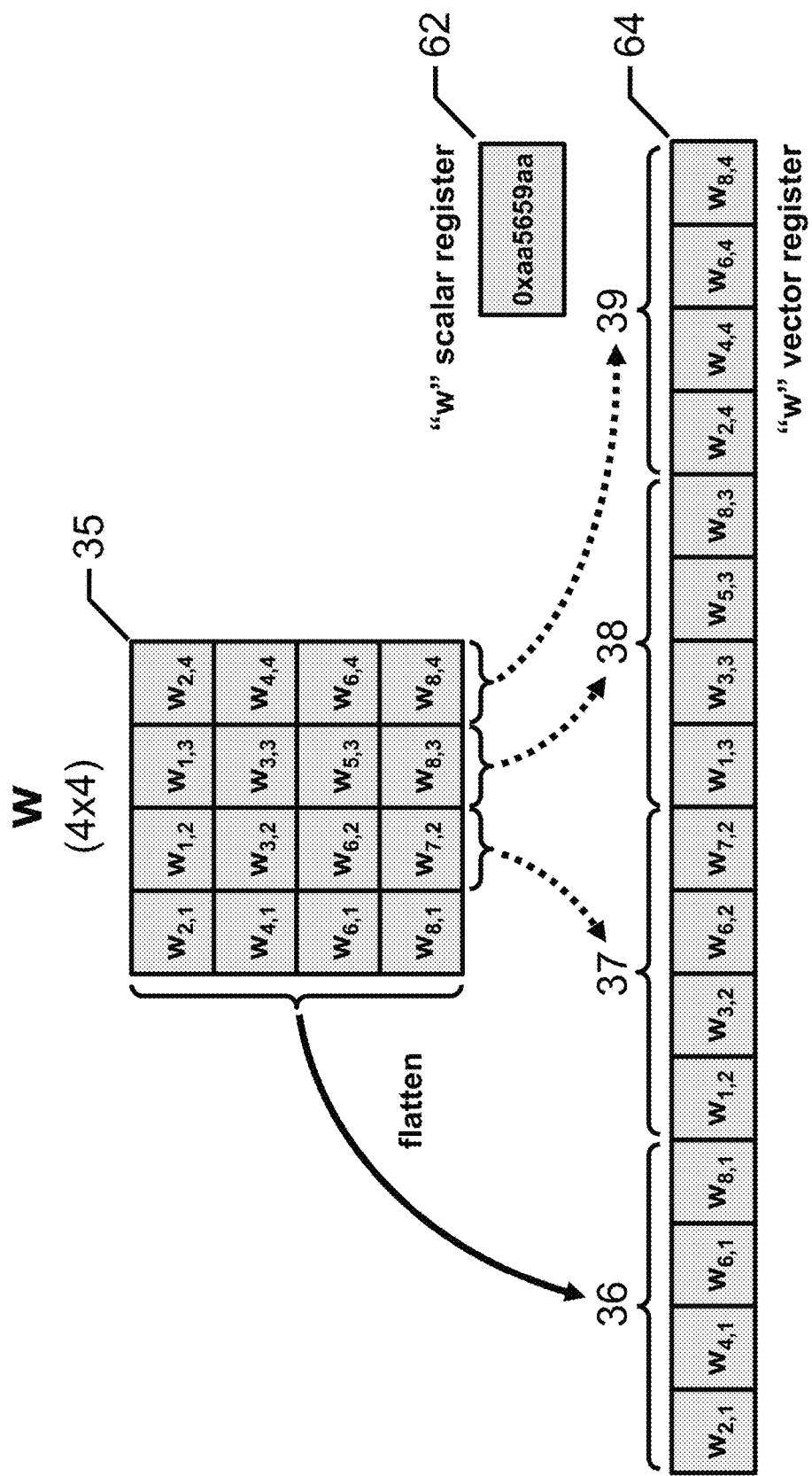

FIGS. 5A and 5B depict compressed matrix flattening processes, in accordance with an embodiment of the present disclosure.

In anticipation of the discussion below, matrices 25 and 35 may be flattened from a matrix representation that is stored in a memory (i.e., e.g., row-major order or column-major order) to a vector representation that is stored in a register. In this embodiment, matrix 25 is flattened by sequentially storing rows 26, 27, 28 and 29 in vector register 54, as depicted in FIG. 5A. Bitmap 20$b$ is stored in scalar register 52. Similarly, matrix 35 is flattened by sequentially storing columns 36, 37, 38 and 39 in vector register 64, as depicted in FIG. 5B. Bitmap 30$b$ is stored in scalar register 62.

Figure 6:
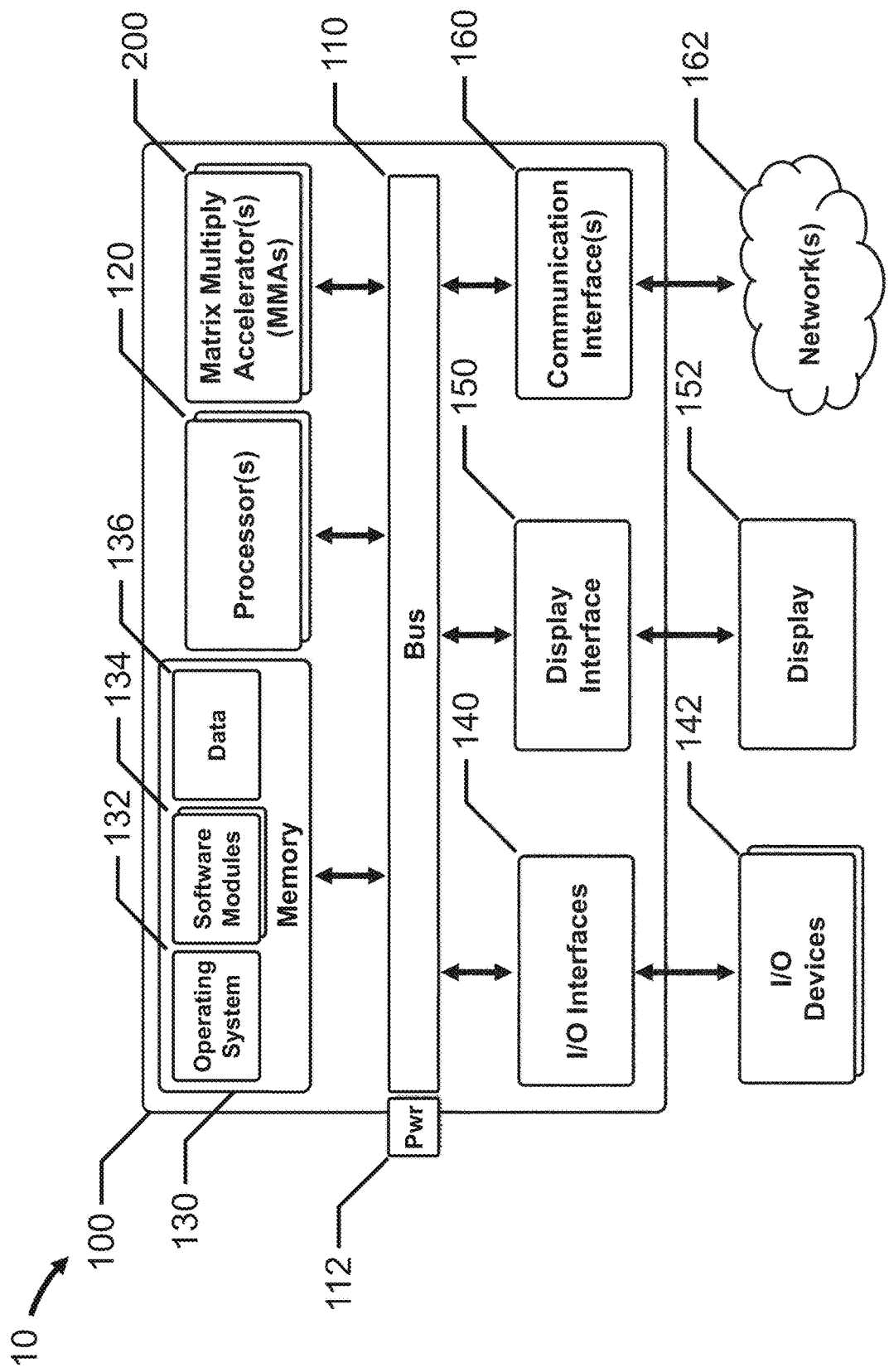
FIG. 6 depicts a block diagram of system 10, in accordance with an embodiment of the present disclosure.

FIG. 6 depicts a block diagram of system 10, in accordance with an embodiment of the present disclosure.

Computer 100 includes bus 110 coupled to one or more processors 120, memory 130, I/O interfaces 140, display interface 150, one or more communication interfaces 160 and one or more MMAs 200. Generally, I/O interfaces 140 are coupled to I/O devices 142 using a wired or wireless connection, display interface 150 is coupled to display 152, and communication interface 160 is connected to network 162 using a wired or wireless connection.

Bus 110 is a communication system that transfers data between processor 120, memory 130, I/O interfaces 140, display interface 150, communication interface 160, MMA 200, as well as other components not depicted in FIG. 1. Power connector 112 is coupled to bus 110 and a power supply (not shown).

Processor 120 includes one or more general-purpose or application-specific microprocessors that executes instructions to perform control, computation, input/output, etc. functions for computer 100. Processor 120 may include a single integrated circuit, such as a micro-processing device, or multiple integrated circuit devices and/or circuit boards working in cooperation to accomplish the functions of processor 120. In addition, processor 120 may execute computer programs or modules, such as operating system 132, software modules 134, etc., stored within memory 130. For example, software modules 134 may include an ML application, an ANN application, a CNN application, etc.

Generally, storage element or memory 130 stores instructions for execution by processor 120 and data. Memory 130 may include a variety of non-transitory computer-readable medium that may be accessed by processor 120. In various embodiments, memory 130 may include volatile and non-volatile medium, non-removable medium and/or removable medium. For example, memory 130 may include any combination of random access memory (RAM), dynamic RAM (DRAM), static RAM (SRAM), read only memory (ROM), flash memory, cache memory, and/or any other type of non-transitory computer-readable medium.

Memory 130 contains various components for retrieving, presenting, modifying, and storing data. For example, memory 130 stores software modules that provide functionality when executed by processor 120. The software modules include operating system 132 that provides operating system functionality for computer 100. Software modules 134 provide various functionality, such as image classification using convolutional neural networks, etc. Data 136 may include data associated with operating system 132, software modules 134, etc.

I/O interfaces 140 are configured to transmit and/or receive data from I/O devices 142. I/O interfaces 140 enable connectivity between processor 120 and I/O devices 142 by encoding data to be sent from processor 120 to I/O devices 142, and decoding data received from I/O devices 142 for processor 120. Generally, data may be sent over wired and/or wireless connections. For example, I/O interfaces 140 may include one or more wired communications interfaces, such as USB, Ethernet, etc., and/or one or more wireless communications interfaces, coupled to one or more antennas, such as WiFi, Bluetooth, cellular, etc.

Generally, I/O devices 142 provide input to computer 100 and/or output from computer 100. As discussed above, I/O devices 142 are operably connected to computer 100 using a wired and/or wireless connection. I/O devices 142 may include a local processor coupled to a communication interface that is configured to communicate with computer 100 using the wired and/or wireless connection. For example, I/O devices 142 may include a keyboard, mouse, touch pad, joystick, etc.

Display interface 150 is configured to transmit image data from computer 100 to monitor or display 152.

Communication interface 160 is configured to transmit data to and from network 162 using one or more wired and/or wireless connections. Network 162 may include one or more local area networks, wide area networks, the Internet, etc., which may execute various network protocols, such as, for example, wired and/or wireless Ethernet, Bluetooth, etc. Network 162 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

MMA 200 is configured to multiply matrices and generate output matrices to support various applications implemented by software modules 134.

Figure 7:
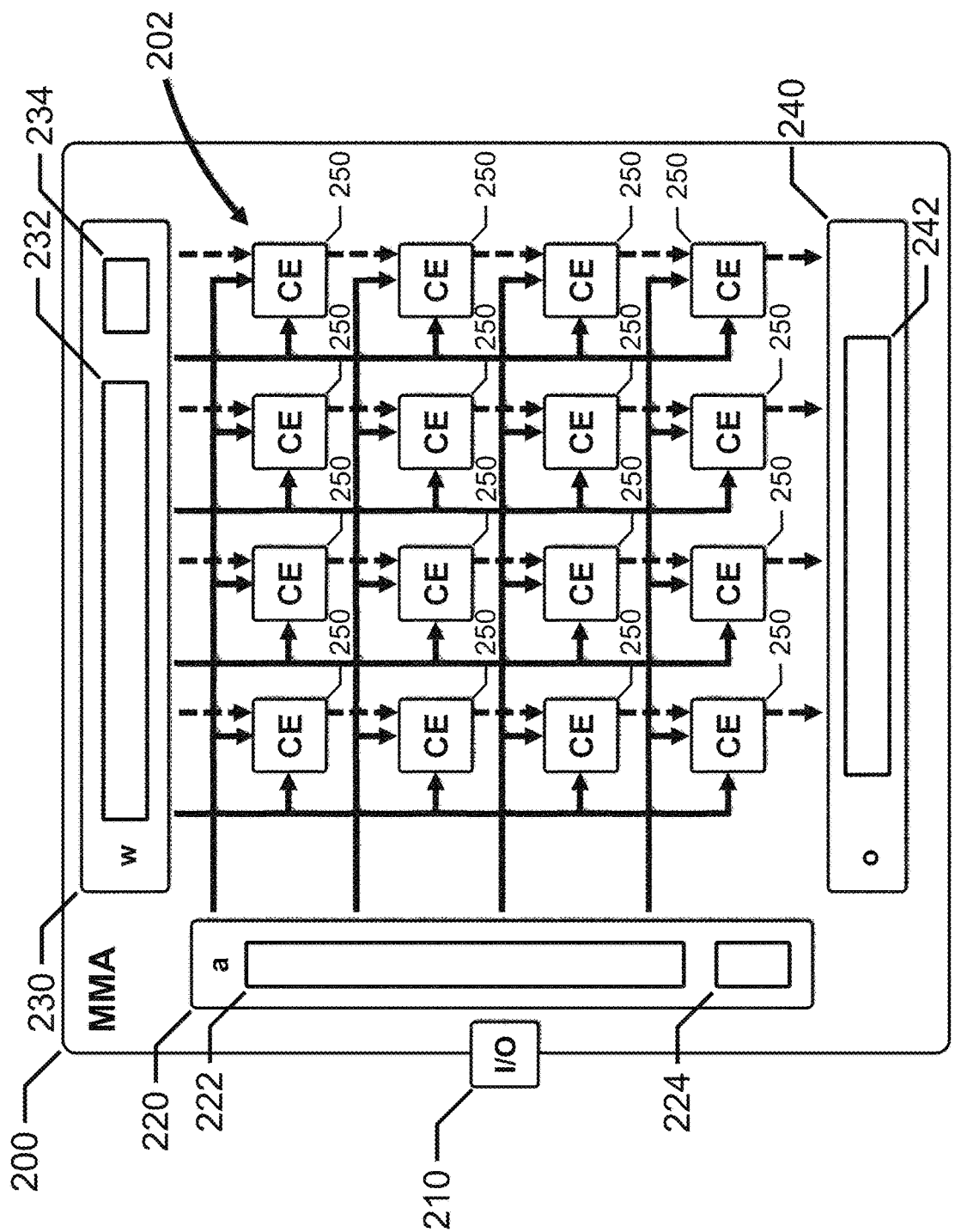
FIG. 7 depicts a block diagram of a matrix multiply accelerator (MMA), in accordance with an embodiment of the present disclosure.

FIG. 7 depicts a block diagram of an MMA, in accordance with an embodiment of the present disclosure.

MMA 200 includes CE array 202, I/O interface 210, register 220, register 230 and register 240.

In this embodiment, CE array 202 includes 16 CEs 250 arranged in a 4×4 array; other numbers of CEs 250 and arrangements are also contemplated, such as, for example, four CEs 250 arranged in a 2×2 array, nine CEs 250 arranged in a 3×3 array, 25 CEs 250 arranged in a 5×5 array, 36 CEs 250 arranged in a 6×6 array, 49 CEs 250 arranged in a 7×7 array, 64 CEs 250 arranged in a 8×8 array, etc. Non-symmetric arrangements, such as a 2×3 array, a 3×4 array, a 4×5 array, a 4×6 array, etc., may be advantageous for certain applications. Each CE 250 is coupled to register 220, register 230 and register 240, and calculates a dot product for one element of output matrix 40.

For example, CE 250 located in the first row and the first column (i.e., upper left corner) of CE array 202 calculates the dot product of the 1$^{st}$ row of matrix 25 and the 1$^{st}$ column of matrix 35, based on bitmap 20b and bitmap 30b, to generate the element for the first row and the first column (i.e., the upper left corner) of output matrix 40. Generally, the first row of CEs 250 receives the first row of data from matrix 25, the second row of CEs 250 receives the second row of data from matrix 25, and so on. Similarly, the first column of CEs 250 receives the first column of data from matrix 35, the second column of CEs 250 receives the second column of data from matrix 35, and so on. A more detailed description of the operation of CE 250 is provided below.

I/O interface 210 is coupled to bus 110, register 220, register 230 and register 240. I/O interface 210 includes a microcontroller that sends data to, and receives data and commands from, processor 120, memory 130, etc. The microcontroller implements set of instructions that control the data flow and the operation of CEs 250.

In some embodiments, a dedicated controller, microcontroller, field programmable gate array (FPGA), etc., may control the data flow and the operation of MMA 200. For example, the controller may implement load/store (L/S) instructions, memory mapped I/O (MMIO), direct memory access (DMA), etc., to load the compressed matrices and corresponding bitmaps into registers 220 and 230, start the matrix multiply operation, read back the output matrix from register 240, etc. More particularly, one or more software modules 134, executing on processor 120, may calculate the bitmaps and compress the matrices, send these data and the appropriate commands to MMA 200 to upload registers 220 and 230, start the matrix multiply operation, read back the results from register 240, etc.

Register 220 includes vector register 222 and scalar register 224. Vector register 222 stores the flattened elements of the first compressed matrix in the multiplication operation, such as matrix 25. Scalar register 224 stores the bitmap associated with the first matrix in the multiplication operation, such as bitmap 20b. In this embodiment, scalar register 224 is 32 bits wide, and vector register 222 is 16 elements wide, each element being the same size as the data contained within matrix 25, such as, for example, 8 bit integer data, 16 bit integer data, 32 bit integer data, 16 bit floating point data, 16 bit Bfloat data, 32 bit floating point data, etc. In certain embodiments, vector register 222 and scalar register 224 have a depth of one register, which allows a single compressed matrix and bitmap to be stored at one time. In other embodiments, vector register 222 and scalar register 224 have a depth of two or more registers, which allows multiple compressed matrices and bitmaps to be stored in a pipeline.

Register 230 includes vector register 232 and scalar register 234. Vector register 232 stores the flattened elements of the second compressed matrix in the multiplication operation, such as matrix 35. Scalar register 234 stores the bitmap associated with the second matrix in the multiplication operation, such as bitmap 30b. In this embodiment, scalar register 234 is 32 bits wide, and vector register 232 is 16 elements wide, each element being the same size as the data contained within matrix 35, such as, for example, 8 bit integer data, 16 bit integer data, 32 bit integer data, 16 bit floating point data, 16 bit Bfloat data, 32 bit floating point data, etc. In certain embodiments, vector register 232 and scalar register 234 have a depth of one register, which allows a single bitmap and compressed matrix to be stored at one time. In other embodiments, vector register 232 and scalar register 234 have a depth of two or more registers, which allows multiple bitmaps and compressed matrices to be stored in a pipeline. Generally, scalar register 224 and 234 have the same width and depth, and vector registers 222 and 232 have the same width and depth. Alternatively, different register dimensions may be advantageous for certain applications.

Register 240 includes vector register 242, which stores the elements of the output matrix in the multiplication operation, such as output matrix 40. In this embodiment, vector register 242 is 16 elements wide, each element being the same size as the data contained within output matrix 40, such as, for example, 8 bit integer data, 16 bit integer data, 32 bit integer data, 16 bit floating point data, 16 bit Bfloat data, 32 bit floating point data, etc. In certain embodiments, vector register 242 has a depth of one register, which allows a single output matrix to be stored at one time. In other embodiments, vector register 242 has a depth of two or more registers, which allows multiple output matrices to be stored in a pipeline. Vector registers 222, 232 and 242 all have the same size, such as, for example, 8 bit integer data, etc.

Figure 8:
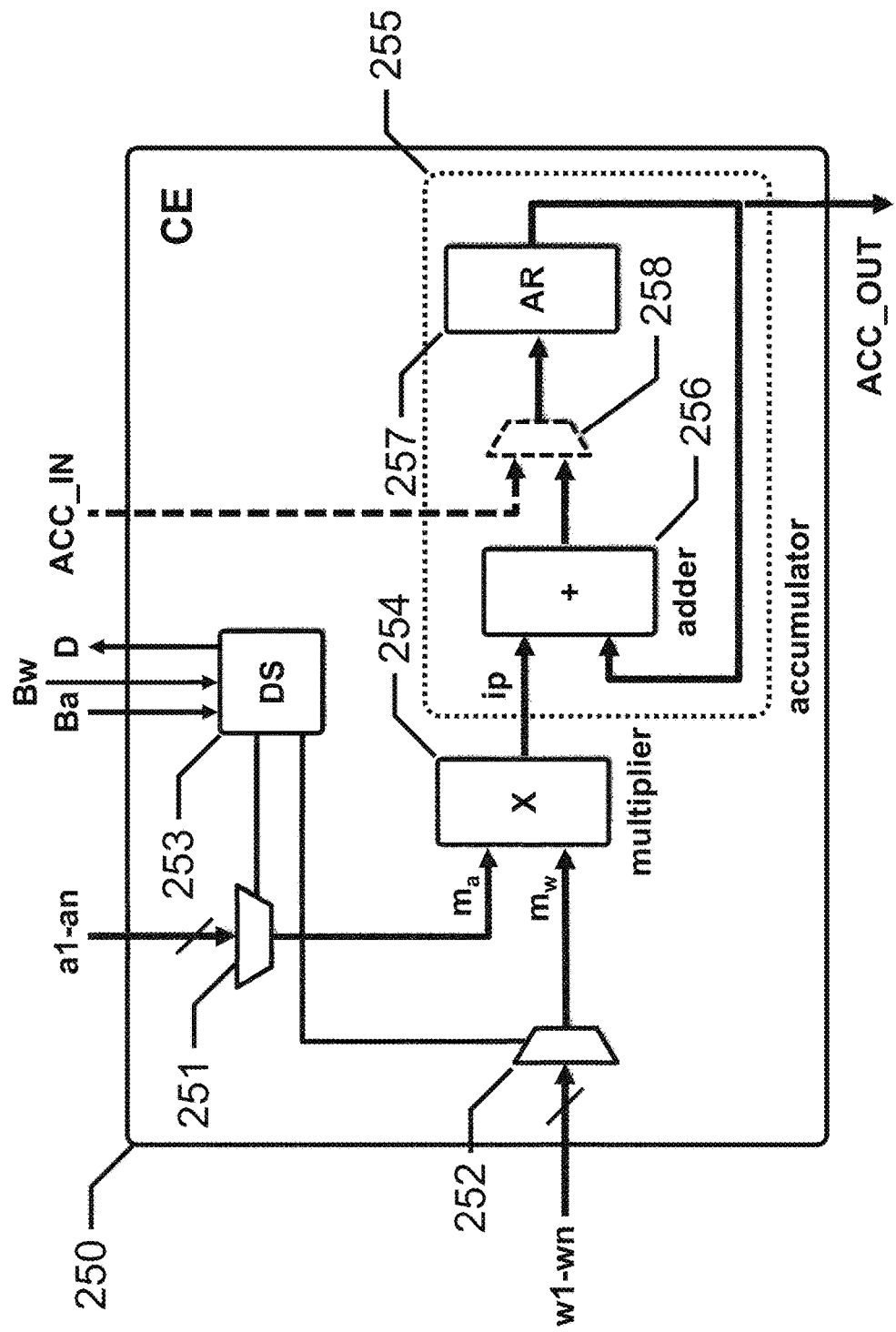
FIG. 8 depicts a block diagram of a compute element (CE) for an MMA, in accordance with an embodiment of the present disclosure.

FIG. 8 depicts a block diagram of a CE for an MMA, in accordance with an embodiment of the present disclosure.

CE 250 includes multiplexer 251, multiplexer 252, data selection circuit 253 coupled to multiplexers 251 and 252, multiplier circuit 254 coupled to multiplexers 251 and 252, and accumulator circuit 255 coupled to multiplier circuit 254.

Multiplexer 251 is coupled to vector register 222 via n sets of m parallel data lines. The number of parallel data line sets, n, is equal to the number of columns in the first compressed matrix in the multiplication operation, such as matrix 25. In the embodiment depicted in FIG. 7, n equals 4; other matrix dimensions are also contemplated, as discussed above. Each parallel data line set transfers one element of one row of the first compressed matrix from vector register 222 to multiplexer 251. The number of parallel data lines, m, in each set is equal to the size of the element in vector register 222, such as 8 for 8 bit integer data, 16 for 16-bit integer data, etc., as discussed above. In other words, the n sets of m parallel data lines transfer one row of data from the first compressed matrix, such as matrix 25. For example, for all of the CEs 250 located in the first row of CE array 202, the elements of the first row of data from matrix 25 that are transferred from vector register 222 are $a_{1,1}$, $a_{1,3}$, $a_{1,5}$ and $a_{1,8}$.

Multiplexer 251 is coupled to data selection circuit 253 via n selection signal lines. Each selection signal line transmits a selection signal that commands multiplexer 251 to select a respective set of parallel data lines to output to multiplier circuit 254. Only a single selection signal is active at one time. Typically, the selection signal is a digital, active high signal; in other embodiments, the selection signal may be a digital, active low signal. And, multiplexer 251 is coupled to multiplier circuit 254 via m parallel data lines.

Multiplexer 252 is coupled to vector register 232 via n sets of m parallel data lines. The number of parallel data line sets, n, is equal to the number of rows in the second compressed matrix in the multiplication operation, such as matrix 35. In the embodiment depicted in FIG. 7, n equals 4; other matrix dimensions are also contemplated, as discussed above. Each parallel data line set transfers one element of one column of the first compressed matrix from vector register 232 to multiplexer 252. The number of parallel data lines, m, in each set is equal to the size of the element in vector register 232, such as 8 for 8 bit integer data, 16 for 16-bit integer data, etc., as discussed above. In other words, the n sets of m parallel data lines transfer one column of data from the second compressed matrix, such as matrix 35. For example, for all of the CEs 250 located in the first column of CE array 202, the elements of the first column of data from matrix 35 that are transferred from vector register 232 are $w_{2,1}$, $w_{4,1}$, $w_{6,1}$ and $w_{7,1}$.

Multiplexer 252 is coupled to data selection circuit 253 via n selection signal lines. Each selection signal line transmits a selection signal that commands multiplexer 252 to select a respective set of parallel data lines to output to multiplier circuit 254. Only a single selection signal is active at one time. Typically, the selection signal is a digital, active high signal; in other embodiments, the selection signal may be a digital, active low signal. And, multiplexer 252 is coupled to multiplier circuit 254 via m parallel data lines.

Data selection circuit 253 is coupled to scalar register 224 via a number data lines, q, equal to the number of columns in the original, uncompressed first matrix, such as matrix 20. In the embodiment depicted in FIGS. 3 and 7, q equals 8. These data lines transfer a portion, Ba, of the bitmap corresponding to the original, uncompressed first matrix, such as bitmap 20b, from scalar register 224 to data selection circuit 253. The portion of the bitmap that is transferred from scalar register 224 corresponds to the row data for first compressed matrix that are transferred from vector register 222 to multiplexer 251. For example, for CE 250 located in the first row and the first column (i.e., upper left corner) of CE array 202, the portion of bitmap 20b that is transferred from scalar register 224 is "10101001" or 0x59.

Data selection circuit 253 is also coupled to scalar register 234 via a number data lines, q, equal to the number of rows in the original, uncompressed second matrix, such as matrix 30. In the embodiment depicted in FIGS. 3 and 7, q equals 8. These data lines transfer a portion, Bw, of the bitmap corresponding to the original, uncompressed second matrix, such as bitmap 30b, from scalar register 234 to data selection circuit 253. The portion of the bitmap that is transferred from scalar register 234 corresponds to the column data for second compressed matrix that are transferred from vector register 232 to multiplexer 252. For example, for CE 250 located in the first row and the first column (i.e., upper left corner) of CE array 202, the portion of bitmap 30b that is transferred from scalar register 234 is "01010101" or 0xaa.

In alternative embodiments, data selection circuit 253 may receive the entire bitmap corresponding to the original, uncompressed first matrix, such as bitmap 20b, from scalar register 224, as well as the entire bitmap corresponding to the original, uncompressed second matrix, such as bitmap 30b, from scalar register 234. In these embodiments, data selection circuit 253 may be configured to extract the appropriate portions from the bitmaps by applying a bit-mask, performing a bit shift operation, etc.

Multiplier circuit 254 is coupled to multiplexer 251 via m parallel data lines, multiplexer 252 via m parallel data lines, and accumulator circuit 255 via m parallel data lines. Multiplier circuit 254 multiplies the data value, ma, provided by multiplexer 251 and the data value, $m_w$, provided by multiplexer 252, and outputs the resulting data value or intermediate product, ip, to accumulator circuit 255. The data values ma, mw and ip have the same size, such as, for example, 8 bit integer, etc.

Accumulator circuit 255 is coupled to multiplier 254 via m parallel data lines, and to one element of vector register 242 via m parallel data lines. Accumulator circuit 255 includes adder circuit 256 and accumulator register 257. Adder circuit 256 adds the intermediate product from multiplier circuit 254 with the current data value stored in accumulator register 257, and outputs the resulting data value to accumulator register 257. At the end of each dot product calculation cycle, described in more detail below, accumulator register 257 outputs a final accumulated data value to the corresponding element of vector register 242 as an ACC_OUT signal. In other words, accumulator circuit 255 receives the respective intermediate products from multiplier circuit 254, and accumulates the respective intermediate products into a value for one element of output matrix 40. In alternative embodiments, accumulator register 257 simply outputs the current data value to the corresponding element of vector register 242 each time a new data value is received from adder circuit 256. In certain embodiments, accumulator circuit 255 may include multiplexer 258 that is configured to daisy-chain the accumulator outputs of each CE 250 in a single row or a single column of CE array 202 using the ACC_IN and ACC_OUT signals.

During a dot product calculation cycle, data selection circuit 253 performs q selection cycles, and multiplier circuit 254 and accumulator circuit 255 perform between 0 and n multiply and add (MAC) cycles. Generally, during each selection cycle, data selection circuit 253 determines whether a bit from the bit portion Ba has a value of 1. If so, data selection circuit 253 sends a selection signal to multiplexer 251 to select a set of m parallel data lines that correspond to the bit. This causes multiplexer 251 to output the data value, ma, to multiplier circuit 254. Data selection circuit 253 also determines whether a bit from the bit portion Bw has a value of 1. If so, data selection circuit 253 sends a selection signal to multiplexer 252 to select a set of m parallel data lines that correspond to the bit. This causes multiplexer 252 to output the data value, mw, to multiplier circuit 254. When multiplier circuit 254 receives two non-zero data values, ma and mw, multiplier circuit 254 and accumulator circuit 255 begin a MAC cycle, during which time the data value ma and the data value mw are multiplied to form an intermediate product ip, and then the ip is accumulated in accumulator register 257.

More particularly, with respect to the embodiments depicted in FIGS. 3, 4, 5A, 5B and 7, q is equal to 8, and n is equal to 4. In the interests of brevity, a single example dot product calculation will be described using CE 250 located in the first row and the first column (i.e., upper left corner) of CE array 202. For this particular CE 250, the bit portion Ba is "10101001" or 0x59, the elements of the first row of data from matrix 25 are $a_{1,1}$, $a_{1,3}$, $a_{1,5}$ and $a_{1,8}$, the bit portion Bw is "01010101" or 0xaa, and the elements of the first column of data from matrix 35 are $w_{2,1}$, $w_{4,1}$, $w_{6,1}$ and $w_{7,1}$.

During the 1st selection cycle, data selection circuit 253 determines that the 1st bit in Ba is equal to 1, and outputs a 1st selection signal (e.g., a digital active high signal) to multiplexer 251. In response to the 1st selection signal, multiplexer 251 selects and outputs the 1st element of the first row of matrix 25, i.e., $a_{1,1}$, to multiplier circuit 254. Data selection circuit 253 also determines that the 1st bit in Bw is equal to 0, and does not output a selection signal (e.g., digital low signal). In response to the digital low signal, multiplexer 251 does not output a data value to multiplier circuit 254. Because multiplier circuit 254 did not receive a data value from multiplexer 252, a MAC cycle is not initiated.

During the $2^{nd}$ selection cycle, data selection circuit 253 determines that the $2^{nd}$ bit in Ba is equal to 0, and does not output a selection signal (e.g., digital low signal). In response to the digital low signal, multiplexer 251 does not output a data value to multiplier circuit 254. Data selection circuit 253 also determines that the $2^{nd}$ bit in Bw is equal to 1, and outputs a 1st selection signal (e.g., a digital active high signal) to multiplexer 252. In response to the 1st selection signal, multiplexer 252 selects and outputs the 1st element of the first column of matrix 25, i.e., $w_{2,1}$, to multiplier circuit 254. Because multiplier circuit 254 did not receive a data value from multiplexer 251, a MAC cycle is not initiated.

During the $3^{rd}$ selection cycle, data selection circuit 253 determines that the $3^{rd}$ bit in Ba is equal to 1, and outputs a $2^{nd}$ selection signal to multiplexer 251. In response to the $2^{nd}$ selection signal, multiplexer 251 selects and outputs the $2^{nd}$ element of the first row of matrix 25, i.e., $a_{1,3}$, to multiplier circuit 254. Data selection circuit 253 also determines that the $3^{rd}$ bit in Bw is equal to 0, and does not output a selection signal. In response to the digital low signal, multiplexer 251 does not output a data value to multiplier circuit 254. Because multiplier circuit 254 did not receive a data value from multiplexer 252, a MAC cycle is not initiated.

During the 4th selection cycle, data selection circuit 253 determines that the 4th bit in Ba is equal to 0, and does not output a selection signal. In response to the digital low signal, multiplexer 251 does not output a data value to multiplier circuit 254. Data selection circuit 253 also determines that the 4th bit in Bw is equal to 1, and outputs a $2^{nd}$ selection signal to multiplexer 252. In response to the $2^{nd}$ selection signal, multiplexer 252 selects and outputs the $2^{nd}$ element of the first column of matrix 25, i.e., $w_{4,1}$, to multiplier circuit 254. Because multiplier circuit 254 did not receive a data value from multiplexer 251, a MAC cycle is not initiated.

During the 5th selection cycle, data selection circuit 253 determines that the 5th bit in Ba is equal to 1, and outputs a $3^{rd}$ selection signal to multiplexer 251. In response to the $3^{rd}$ selection signal, multiplexer 251 selects and outputs the $3^{rd}$ element of the first row of matrix 25, i.e., $a_{1,5}$, to multiplier circuit 254. Data selection circuit 253 also determines that the 5th bit in Bw is equal to 0, and does not output a selection signal. In response to the digital low signal, multiplexer 251 does not output a data value to multiplier circuit 254. Because multiplier circuit 254 did not receive a data value from multiplexer 252, a MAC cycle is not initiated.

During the $6^{th}$ selection cycle, data selection circuit 253 determines that the $6^{th}$ bit in Ba is equal to 0, and does not output a selection signal. In response to the digital low signal, multiplexer 251 does not output a data value to multiplier circuit 254. Data selection circuit 253 also determines that the $6^{th}$ bit in Bw is equal to 1, and outputs a $3^{rd}$ selection signal to multiplexer 252. In response to the $3^{rd}$ selection signal, multiplexer 252 selects and outputs the $3^{rd}$ element of the first column of matrix 25, i.e., $w_{6,1}$, to multiplier circuit 254. Because multiplier circuit 254 did not receive a data value from multiplexer 251, a MAC cycle is not initiated.

During the $7^{th}$ selection cycle, data selection circuit 253 determines that the $7^{th}$ bit in Ba is equal to 0, and does not output a selection signal. In response to the digital low signal, multiplexer 251 does not output a data value to multiplier circuit 254. Data selection circuit 253 also determines that the $7^{th}$ bit in Bw is equal to 0, and does not output a selection signal. In response to the digital low signal, multiplexer 251 does not output a data value to multiplier circuit 254. Because multiplier circuit 254 did not receive data values from multiplexers 251 and 252, a MAC cycle is not initiated.

During the $8^{th}$ selection cycle, data selection circuit 253 determines that the $8^{th}$ bit in Ba is equal to 1, and outputs a $4^{th}$ selection signal to multiplexer 251. In response to the $4^{th}$ selection signal, multiplexer 251 selects and outputs the $4^{th}$ element of the first row of matrix 25, i.e., $a_{1,8}$, to multiplier circuit 254. Data selection circuit 253 also determines that the $8^{th}$ bit in Bw is equal to 1, and outputs a $4^{th}$ selection signal to multiplexer 252. In response to the $4^{th}$ selection signal, multiplexer 252 selects and outputs the $4^{th}$ element of the first column of matrix 25, i.e., $w_{8,1}$, to multiplier circuit 254. Because multiplier circuit 254 received data values from multiplexers 251 and 252, a MAC cycle is initiated. Multiplier circuit 254 multiplies the elements $a_{1,8}$ and $w_{8,1}$, and then outputs the intermediate product ip to accumulator circuit 255. Adder circuit 256 adds the value of the intermediate product ip to the current value of accumulator register 257, which is 0, and then stores the result in accumulator register 257.

At the conclusion of the $8^{th}$ selection cycle, the current value stored in accumulator register 257 is output to vector register 242, and data selection circuit 253 outputs a "done" signal to the microcontroller for CE 250, such as I/O interface 210 or a dedicated microcontroller, that the dot product calculation for this particular CE 250 is complete. Data selection circuit 253 now waits until new bit portions, Ba and Bw, are respectively received from scalar registers 224 and 234 before initiating a new dot product calculation.

In this example, CE 250 performed 8 selection cycles and one MAC cycle. Because each CE 250 performs 8 selection cycles and up to 4 MAC cycles per dot product calculation, coordination of the CEs 250 is necessary. In one embodiment, this coordination is facilitated by the "done" signal. For example, CE 250 located in the first row and the second column of CE array 202 will perform 8 selection cycles and two MAC cycles, CE 250 located in the first row and the third column of CE array 202 will perform 8 selection cycles and four MAC cycles, and CE 250 located in the first row and the fourth column of CE array 202 will perform 8 selection cycles and one MAC cycle. And so forth.

Figure 9:
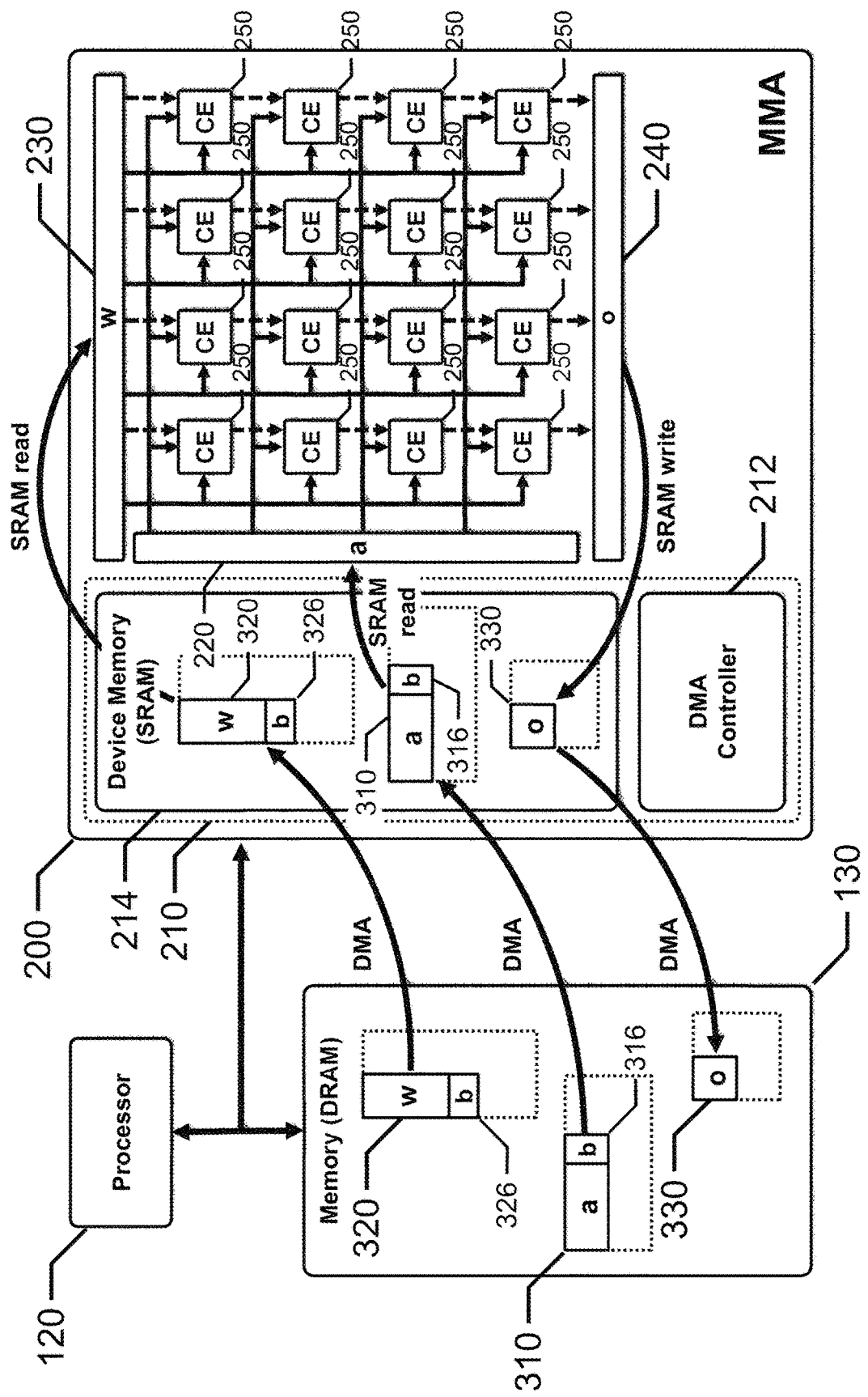
FIG. 9 depicts a dataflow diagram for a system with an MMA, in accordance with another embodiment of the present disclosure.

FIG. 9 depicts a dataflow diagram for a system with an MMA, in accordance with another embodiment of the present disclosure.

In this embodiment, I/O interface 210 includes direct memory access (DMA) controller 212 and device memory 214, such as, for example, SRAM. Under the control of processor 120 and DMA controller 212, compressed matrix 310 and bitmap 316 are transferred from memory 130 to device memory 214, and compressed matrix 320 and bitmap 326 are transferred from memory 130 to device memory 214. Under control of DMA controller 212, compressed matrix 310 is transferred from device memory 214 to vector register 222, bitmap 316 is transferred from device memory 214 to scalar register 224, compressed matrix 320 is transferred from device memory 214 to vector register 232, and bitmap 326 is transferred from device memory 214 to scalar register 234. After the completion of the matrix multiply operation and under the control of DMA controller 212, output matrix 330 is transferred from vector register 242 to device memory 214, and then, under the control of DMA controller 212 and processor 120, output matrix 330 is transferred from device memory 214 to memory 130.

Table 1 presents the number of MAC operations or cycles for system 10 for different operand sparsity levels, in accordance with the embodiments depicted in FIGS. 3, 4, 5A, 5B and 7.

|  | MAC Operations | | | |
| --- | --- | --- | --- | --- |
|  | Operand 2 30% | Operand 2 50% | Operand 2 70% | Operand 2 90% |
| Operand 1 30% | 3.89 | 2.80 | 1.68 | 0.56 |
| Operand 1 50% | 2.80 | 2.00 | 1.20 | 0.40 |
| Operand 1 70% | 1.68 | 1.20 | 0.72 | 0.24 |
| Operand 1 90% | 0.56 | 0.40 | 0.24 | 0.08 |

Due to the randomness of the input data, each CE 250 may have a different number MAC cycles, from 0 to 4 cycles, for any given operand vectors, even though the average could be less than 1.0. At the border between a sparse matrix and a dense matrix, i.e., operand 1 at 50% and operand 2 at 50%, any given CE 250 only requires 2.0 MAC cycles to compute the dot product for one element of output matrix 40. A standard MAC configuration requires 8 MAC operations to compute the dot product for one element of output matrix 40, due to the necessity of multiplying an 8 element row vector from matrix 20 (4×8) with an 8 element column vector from matrix 30 (8×4). The advantages of the present disclosure provide a fourfold (×4) improvement over a standard MAC configuration for 50% sparsity levels, which increases to an elevenfold (×11) improvement for 70% sparsity levels, and a hundredfold (×100) improvement for 90% sparsity levels.

To increase the utilization of each CE 250, in one embodiment, buffers maybe added to CE array 202 to compensate for the randomness of the input data.

Figure 10:
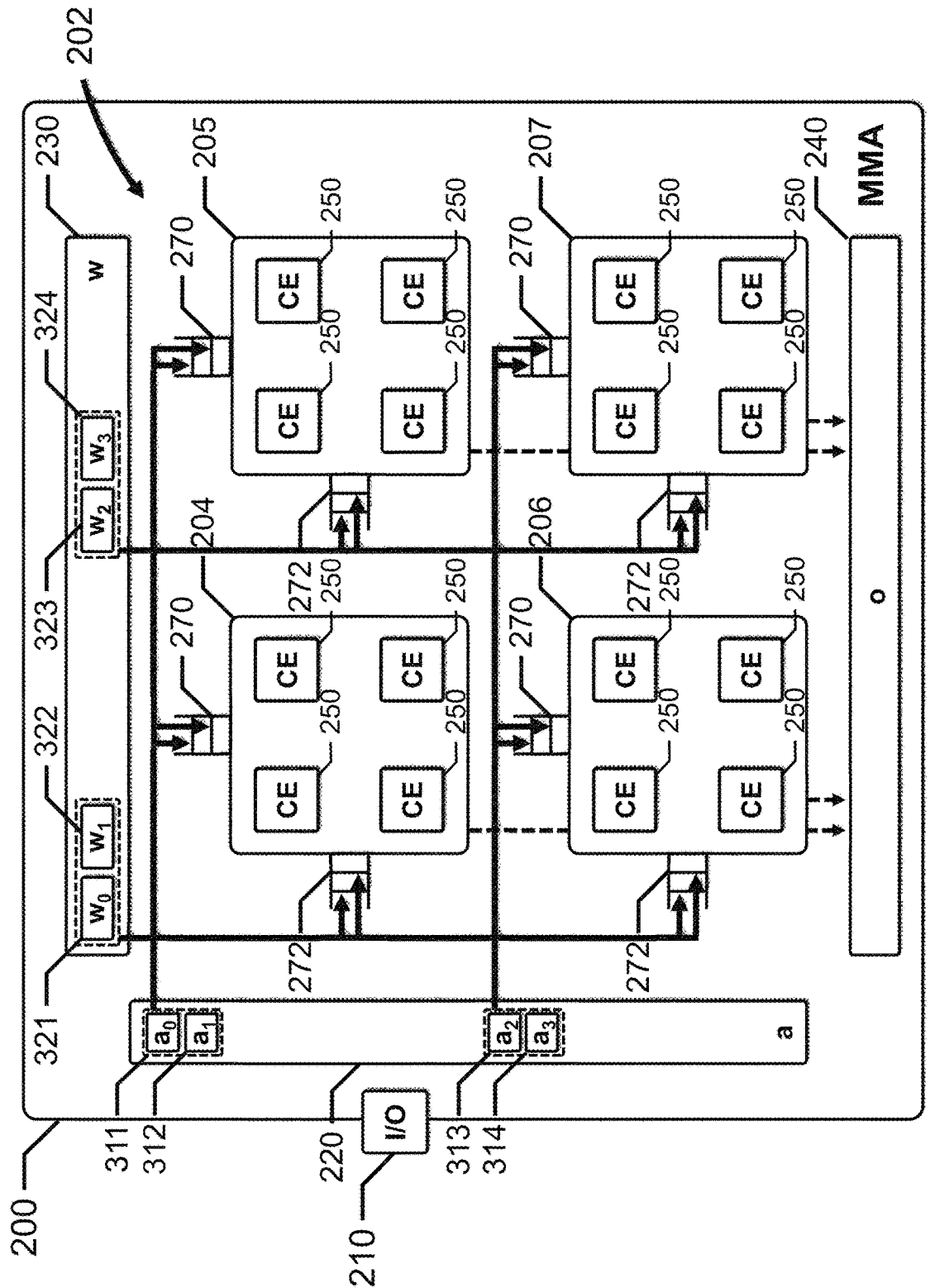
FIG. 10 depicts a block diagram of an MMA, in accordance with another embodiment of the present disclosure.

FIG. 10 depicts a block diagram of an MMA, in accordance with another embodiment of the present disclosure.

CE array 202 has been partitioned into CE zones 204, 205, 206 and 207, each including 4 CEs 250. Buffers 270 are disposed between each CE zone 204, 205, 206 and 207 and register 220, and buffers 272 are disposed between each CE zone 204, 205, 206 and 207 and register 230. The CEs 250 within each CE zone 204, 205, 206 and 207 process the vector operands and related bitmaps queued within buffers 270 and 272. In this embodiment, buffers 270 and 272 have a depth of 2 vector operands and related bitmaps.

For CE zone 204, buffer 270 receives vector operands/bitmaps 311 and 312 and buffer 272 receives vector operands/bitmaps 321 and 322. For CE zone 205, buffer 270 receives vector operands/bitmaps 311 and 312 and buffer 272 receives vector operands/bitmaps 323 and 324. For CE zone 206, buffer 270 receives vector operands/bitmaps 313 and 314 and buffer 272 receives vector operands/bitmaps 321 and 322. For CE zone 207, buffer 270 receives vector operands/bitmaps 313 and 314 and buffer 272 receives vector operands/bitmaps 323 and 324. Each CE zone 204, 205, 206 and 207 operates independently as long as buffers 270 and 272 are filled.

Figure 11A:
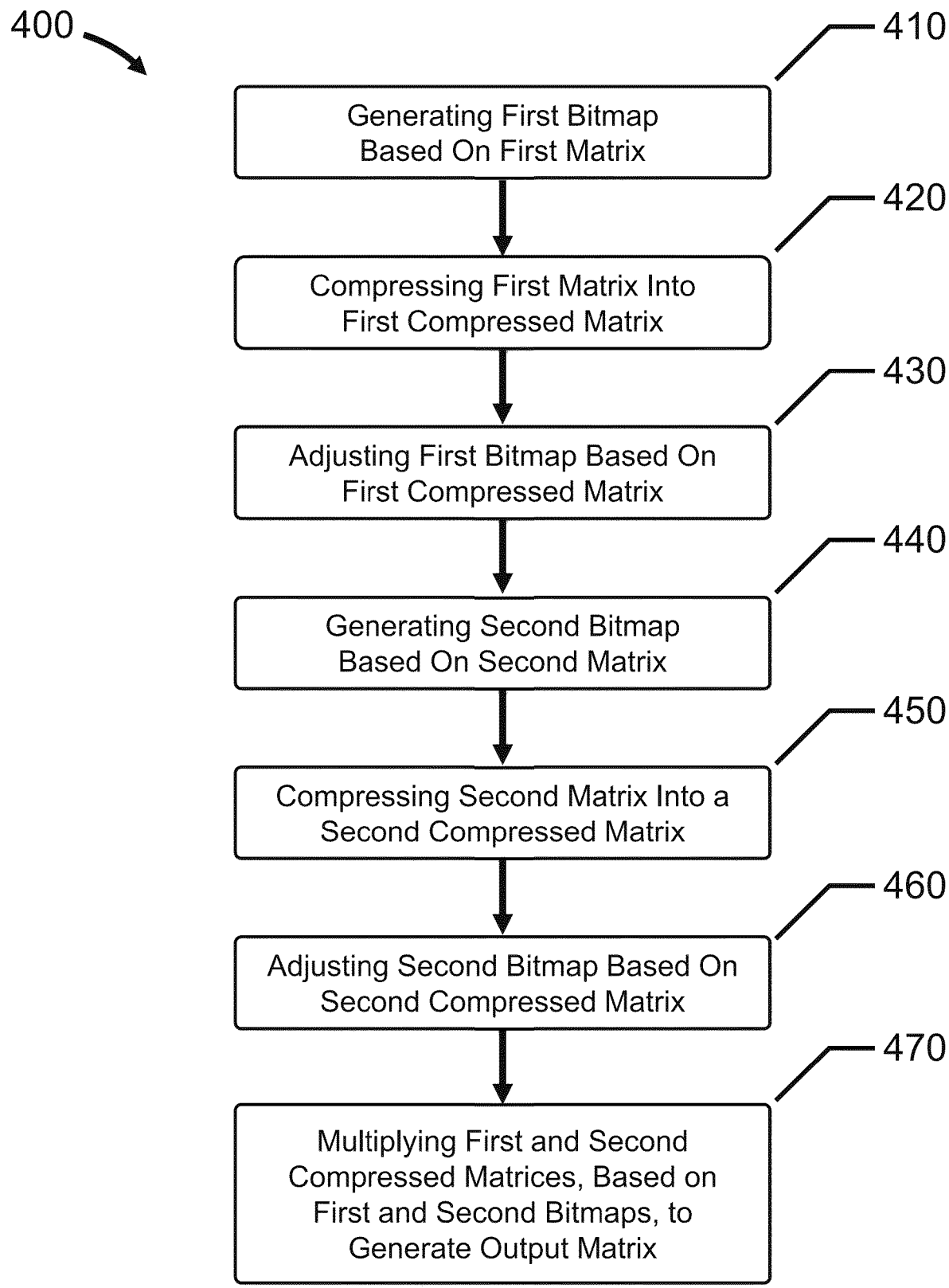
FIGS. 11A and 11B depict flow diagrams presenting functionality for multiplying matrices, in accordance with embodiments of the present disclosure.
Figure 11B:
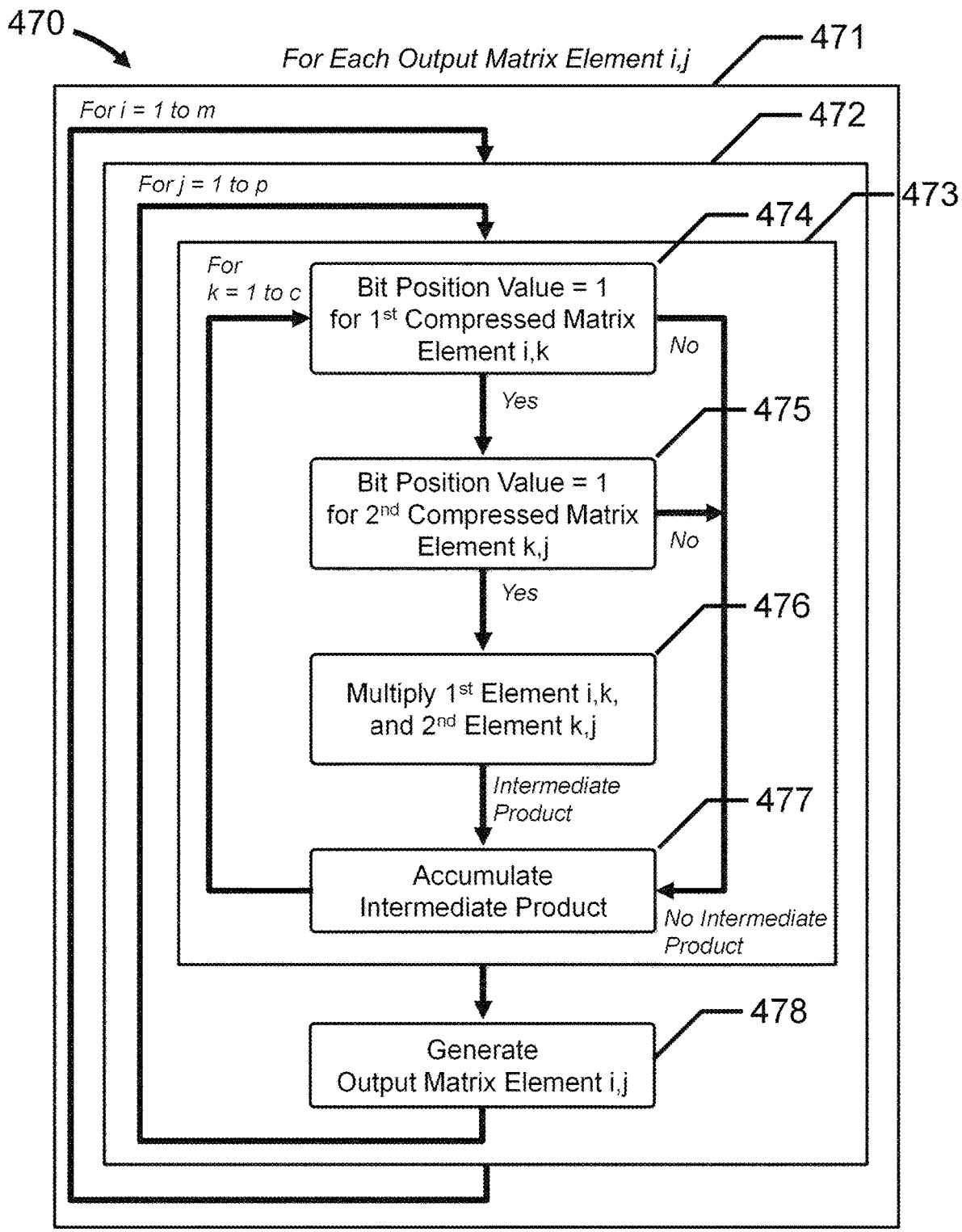

FIGS. 11A and 11B depict flow diagrams presenting functionality for multiplying matrices, in accordance with embodiments of the present disclosure.

FIG. 11A depicts flow diagram 400, in accordance with an embodiment of the present disclosure.

At 410, a first bitmap is generated based on a first matrix, such as, for example, generating bitmap 20b based on matrix 20, as discussed above. Each bit position in the first bitmap corresponds to a different element of the first matrix, and has a value of 1 when the value of the corresponding element of the first matrix is not 0, and a value of 0 when the value of the corresponding element of the first matrix is 0.

At 420, the first matrix is compressed into a first compressed matrix that has fewer elements with a value of 0 than the first matrix, such as, for example, compressing matrix 20 into matrix 25, as discussed above. In some embodiments, the first compressed matrix will only include elements that have non-zero values. In other embodiments, the first compressed matrix will include one or more elements that have a value of 0 in order to maintain compatible dimensions for the multiplication operation.

At 430, the first bitmap is adjusted based on the first compressed matrix. Elements within the first compressed matrix that have a value of 0 are treated as non-zero elements, and their respective bit values are adjusted to 1 in the first bitmap. Even though the first compressed matrix may include elements that have a value of 0, these elements only minimally effect the overall advantages provided by the present disclosure. In the embodiment discussed above, bitmap 20b does not need to be adjected because matrix 25 does not have non-zero value elements.

At 440, a second bitmap is generated based on a second matrix, such as, for example, generating bitmap 30b based on matrix 30, as discussed above. Each bit position in the second bitmap corresponds to a different element of the second matrix, and has a value of 1 when the value of the corresponding element of the second matrix is not 0, and a value of 0 when the value of the corresponding element of the second matrix is 0.

At 450, the second matrix is compressed into a second compressed matrix that has fewer elements with a value of 0 than the second matrix, such as, for example, compressing matrix 30 into matrix 35, as discussed above. In some embodiments, the second compressed matrix will only include elements that have non-zero values. In other embodiments, the second compressed matrix will include one or more elements that have a value of 0 in order to maintain compatible dimensions for the multiplication operation.

At 460, the second bitmap is adjusted based on the second compressed matrix. Elements within the second compressed matrix that have a value of 0 are treated as non-zero elements, and their respective bit values are adjusted to 1 in the second bitmap. Even though the second compressed matrix may include elements that have a value of 0, these elements only minimally effect the overall advantages provided by the present disclosure. In the embodiment discussed above, bitmap 30b does not need to be adjected because matrix 35 does not have non-zero value elements.

At 470, the first compressed matrix and the second compressed matrix are multiplied together, based on the first bitmap and the second bitmap, to generate an output matrix, such as, for example, multiplying matrix 25 with matrix 35 based on bitmaps 20b and 30b, as discussed above. More particularly, for each element i,j in the output matrix, a dot product of the $i^{th}$ row of the first compressed matrix and the $j^{th}$ column of the second compressed matrix is calculated based on the first bitmap and the second bitmap.

FIG. 11B depicts a flow diagram for functional block 470, in accordance with an embodiment of the present disclosure.

In this embodiment, the first matrix has m rows and n columns, the first compressed matrix has m rows and c columns, n is a multiple of c, and the number of non-zero elements in the first matrix is equal to or less than c times m. The second matrix has n rows and p columns, the second compressed matrix has c rows and p columns, and the number of non-zero elements in the second matrix is equal to or less than c times p. The output matrix has m rows and p columns, the row index i for the output matrix goes from 1 to m, and the column index j for the output matrix goes from 1 to p. In the embodiments discussed above, m is 4, n is 8, p is 4 and c is 4 for matrices 20, 25, 30 and 35.

Functional block 470 includes process loop 471, process loop 472 and process loop 473. Process loop 471 iterates output matrix row index i from 1 to m, process loop 472 iterates output matrix column index j from 1 to p, and process loop 473 iterates output matrix element i,j dot product index k from 1 to c. Within process loop 473, the functionality for calculating the dot product for output matrix element i,j includes functional blocks 474, 475, 476 and 477. Functional block 478 generates each output matrix element i,j based on the accumulated intermediate products determined by process loop 473.

Generally, when the bit position in the first bitmap corresponding to an element i,k of the $i^{th}$ row of the first compressed matrix has the value of 1 and when the bit position in the second bitmap corresponding to an element k,j of the $j^{th}$ column of the second compressed matrix has the value of 1, the element i,k and the element k,j are multiplied to generate an intermediate product.

More particularly, at 474, the value of the bit position in the first bitmap corresponding to an element i,k of the $i^{th}$ row of the first compressed matrix is determined. If the value of this bit position is 1, flow proceeds to 475. At 475, the value of the bit position in the second bitmap corresponding to an element k,j of the $j^{th}$ column of the second compressed matrix is determined. If the value of this bit position is 1, flow proceeds to 476. At 476, the element i,k and the element k,j are multiplied to generate an intermediate product, and flow proceeds to 477.

Generally, when the bit position in the first bitmap corresponding to an element i,k of the $i^{th}$ row of the first compressed matrix has the a value of 0 or when the bit position in the second bitmap corresponding to an element k,j of the $j^{th}$ column of the second compressed matrix has the value of 0, the element i,k and the element k,j are not multiplied.

As discussed above, at 474, the value of the bit position in the first bitmap corresponding to an element i,k of the $i^{th}$ row of the first compressed matrix is determined. If the value of this bit position is 0, no intermediate product is calculated and flow proceeds to 477. At 475, the value of the bit position in the second bitmap corresponding to an element k,j of the $j^{th}$ column of the second compressed matrix is determined. If the value of this bit position is 0, no intermediate product is calculated and flow proceeds to 477.

Generally, the intermediate products are accumulated to generate the element i,j, More particularly, at 477, the intermediate products are accumulated, i.e., added to a running total of the previous intermediate values determined by process loop 473. At 478, output matrix element i,j is generated based on the accumulated intermediate products determined by process loop 473.

Embodiments of the present disclosure advantageously provide a system and a computer-based method for multiplying matrices. The embodiments described above and summarized below are combinable.

In one embodiment, a computer-based method for multiplying matrices includes generating a first bitmap based on a first matrix, the first bitmap having a plurality of bit positions, each bit position corresponding to a different element of the first matrix, each bit position having a value of 1 when a value of the corresponding element of the first matrix is not 0, and a value of 0 when the value of the corresponding element of the first matrix is 0; compressing the first matrix into a first compressed matrix, the first compressed matrix including fewer elements having a value of 0 than the first matrix; adjusting the first bitmap based on the first compressed matrix; generating a second bitmap based on a second matrix, the second bitmap having a plurality of bit positions, each bit position corresponding to a different element of the second matrix, each bit position having the value of 1 when a value of the corresponding element of the second matrix is not 0, and the value of 0 when the value of the corresponding element of the second matrix is 0; compressing the second matrix into a second compressed matrix, the second compressed matrix including fewer elements having a value of 0 than the second matrix; adjusting the second bitmap based on the second compressed matrix; multiplying the first compressed matrix and the second compressed matrix, based on the first bitmap and the second bitmap, to generate an output matrix, including for each element i,j in the output matrix, calculating a dot product of the $i^{th}$ row of the first compressed matrix and the $j^{th}$ column of the second compressed matrix based on the first bitmap and the second bitmap.

In one embodiment, a system includes a memory, a processor coupled to the memory, and an MMA coupled to the processor and the memory. The processor is configured to generate a first bitmap based on a first matrix, the first bitmap having a plurality of bit positions, each bit position corresponding to a different element of the first matrix, each bit position having a value of 1 when a value of the corresponding element of the first matrix is not 0, and a value of 0 when the value of the corresponding element of the first matrix is 0; compress the first matrix into a first compressed matrix, the first compressed matrix including fewer elements having the value of 0 than the first matrix; adjust the first bitmap based on the first compressed matrix; generate a second bitmap based on a second matrix, the second bitmap having a plurality of bit positions, each bit position corresponding to a different element of the second matrix, each bit position having the value of 1 when a value of the corresponding element of the second matrix is not 0, and the value of 0 when the value of the corresponding element of the second matrix is 0; compress the second matrix into a second compressed matrix, the second compressed matrix including fewer elements having the value of 0 than the second matrix; adjust the second bitmap based on the second compressed matrix. The MMA is configured to multiply the first compressed matrix and the second compressed matrix to generate an output matrix, including for each element i,j of the output matrix, calculate a dot product of the $i^{th}$ row of the first compressed matrix and the $j^{th}$ column of the second compressed matrix based on the first bitmap and the second bitmap.

In one embodiment, the MMA includes a first scalar register to store the first bitmap; a first vector register to store the first compressed matrix; a second scalar register to store the second bitmap; and a second vector register to store the second compressed matrix; an output register to store the output matrix; and an array of compute elements (CEs), coupled to the first scalar register, the second scalar register, the first vector register, the second vector register and the output register, each CE calculating the dot product for a different element i,j of the output matrix.

In one embodiment, each CE includes a first multiplexer to receive a row of the first compressed matrix, the row including a plurality of first elements, and to selectively output each of the first elements of the row based on a first data selection signal; a second multiplexer to receive a column of the second compressed matrix, the column including a plurality of second elements, and to selectively output each of the second elements of the column based on a second data selection signal; a data selection circuit, coupled to the first multiplexer and the second multiplexer, to receive the first bitmap and the second bitmap, to generate the first data selection signal based on the first bitmap, and to generate the second data selection signal based on the second bitmap; a multiplier circuit, coupled to the first multiplexer and the second multiplexer, to receive the first elements selectively output by the first multiplexer and the second elements selectively output by the second multiplexer, to multiply respective first elements and second elements to generate respective intermediate products, and to output the respective intermediate products; and an accumulator circuit, coupled to the multiplier circuit, to receive the respective intermediate products, and to accumulate the respective intermediate products into a value for one element of the output matrix.

In one embodiment, the first matrix has m rows and n columns, the first compressed matrix has m rows and c columns, and n is a multiple of c; the second matrix has n rows and p columns, and the second compressed matrix has c rows and p columns; the output matrix has m rows and p columns; and i goes from 1 to m, and j goes from 1 to p.

In one embodiment, calculating the dot product of the $i^{th}$ row of the first compressed matrix and the $j^{th}$ column of the second compressed matrix based on the first bitmap and the second bitmap includes when the bit position in the first bitmap corresponding to an element i,k of the $i^{th}$ row of the first compressed matrix has a value of 1 and when the bit position in the second bitmap corresponding to an element k,j of the $j^{th}$ column of the second compressed matrix has a value of 1, multiplying the element i,k and the element k,j to generate an intermediate product; when the bit position in the first bitmap corresponding to an element i,k of the $i^{th}$ row of the first compressed matrix has a value of 0 or when the bit position in the second bitmap corresponding to an element k,j of the $j^{th}$ column of the second compressed matrix has a value of 0, not multiplying the element i,k and the element k,j; and summing the intermediate products to generate the element i,j; where k goes from 1 to c.

In one embodiment, compressing the first matrix into the first compressed matrix includes beginning with an element located at a first row and a first column of the first matrix, move each element of the first matrix that has a non-zero value into the first compressed matrix in row major order, and when a row of the first matrix has less than c elements that have a non-zero value, move one or more elements that have a zero value into the first compressed matrix so that the corresponding row of the first compressed matrix has c elements; and adjusting the first bitmap based on the first compressed matrix includes change the corresponding bit values in the first bit map from 0 to 1 for said one or more elements of the first matrix that have a zero value that are moved into the first compressed matrix.

In one embodiment, compressing the second matrix into the second compressed matrix includes beginning with an element located at a first row and a first column of the second matrix, move each element of the second matrix that has a non-zero value into the second compressed matrix in column major order, and when a column of the second matrix has less than c elements that have a non-zero value, move one or more elements that have a zero value into the second compressed matrix so that the corresponding column of the second compressed matrix has c elements; and adjusting the second bitmap based on the second compressed matrix includes change the corresponding bit values in the second bit map from 0 to 1 for said one or more elements of the second matrix that have a zero value that are moved into the second compressed matrix.

In one embodiment, a first number of non-zero elements in the first matrix is equal to or less than c times m, and a second number of non-zero elements in the second matrix is equal to or less than c times p.

In one embodiment, compressing the first matrix into the first compressed matrix is performed in place, and said compress the second matrix into the second compressed matrix is performed in place.

In one embodiment, a non-transitory computer-readable medium stores instructions that, when executed by a processor, cause the processor to multiply matrices according to the method described above.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A system, comprising:
   a memory;
   a processor, coupled to the memory, configured to:
     generate a first bitmap based on a first matrix, the first bitmap having a plurality of bit positions, each bit position corresponding to a different element of the first matrix, each bit position having a value of 1 when a value of the corresponding element of the first matrix is not 0, and a value of 0 when the value of the corresponding element of the first matrix is 0,
     compress the first matrix into a first compressed matrix, the first compressed matrix including fewer elements having the value of 0 than the first matrix,
     adjust the first bitmap based on the first compressed matrix,
     generate a second bitmap based on a second matrix, the second bitmap having a plurality of bit positions, each bit position corresponding to a different element of the second matrix, each bit position having the value of 1 when a value of the corresponding element of the second matrix is not 0, and the value of 0 when the value of the corresponding element of the second matrix is 0,
     compress the second matrix into a second compressed matrix, the second compressed matrix including fewer elements having the value of 0 than the second matrix, and
     adjust the second bitmap based on the second compressed matrix; and
   a matrix multiply accelerator (MMA), coupled to the processor and the memory, configured to multiply the first compressed matrix and the second compressed matrix to generate an output matrix, including:
     for each element i,j of the output matrix, calculate a dot product of the $i^{th}$ row of the first compressed matrix and the $j^{th}$ column of the second compressed matrix based on the first bitmap and the second bitmap.

2. The system according to claim 1, where the MMA includes:
   a first scalar register to store the first bitmap;
   a first vector register to store the first compressed matrix;
   a second scalar register to store the second bitmap;
   a second vector register to store the second compressed matrix;
   an output register to store the output matrix; and
   an array of compute elements (CEs), coupled to the first scalar register, the second scalar register, the first vector register, the second vector register and the output register, each CE calculating the dot product for a different element i,j of the output matrix.

3. The system according to claim 2, where each CE includes:
   a first multiplexer to receive a row of the first compressed matrix, the row including a plurality of first elements, and to selectively output each of the first elements of the row based on a first data selection signal;
   a second multiplexer to receive a column of the second compressed matrix, the column including a plurality of second elements, and to selectively output each of the second elements of the column based on a second data selection signal;
   a data selection circuit, coupled to the first multiplexer and the second multiplexer, to receive the first bitmap and the second bitmap, to generate the first data selection signal based on the first bitmap, and to generate the second data selection signal based on the second bitmap;
   a multiplier circuit, coupled to the first multiplexer and the second multiplexer, to receive the first elements selectively output by the first multiplexer and the second elements selectively output by the second multiplexer, to multiply respective first elements and second elements to generate respective intermediate products, and to output the respective intermediate products; and an accumulator circuit, coupled to the multiplier circuit, to receive the respective intermediate products, and to accumulate the respective intermediate products into a value for one element of the output matrix.

4. The system according to claim 1, where:

the first matrix has m rows and n columns, the first compressed matrix has m rows and c columns, and n is a multiple of c;

the second matrix has n rows and p columns, and the second compressed matrix has c rows and p columns;

the output matrix has m rows and p columns; and i goes from 1 to m, and j goes from 1 to p.

5. The system according to claim 4, where said calculate the dot product of the $i^{th}$ row of the first compressed matrix and the $j^{th}$ column of the second compressed matrix based on the first bitmap and the second bitmap includes:

when the bit position in the first bitmap corresponding to an element i,k of the $i^{th}$ row of the first compressed matrix has a value of 1 and when the bit position in the second bitmap corresponding to an element k,j of the $j^{th}$ column of the second compressed matrix has a value of 1, multiplying the element i,k and the element k,j to generate an intermediate product;

when the bit position in the first bitmap corresponding to an element i,k of the $i^{th}$ row of the first compressed matrix has a value of 0 or when the bit position in the second bitmap corresponding to an element k,j of the $j^{th}$ column of the second compressed matrix has a value of 0, not multiplying the element i,k and the element k,j; and summing the intermediate products to generate the element i,j;

where k goes from 1 to c.

6. The system according to claim 5, where:

said compress the first matrix into the first compressed matrix includes:

beginning with an element located at a first row and a first column of the first matrix, move each element of the first matrix that has a non-zero value into the first compressed matrix in row major order, and when a row of the first matrix has less than c elements that have a non-zero value, move one or more elements that have a zero value into the first compressed matrix so that the corresponding row of the first compressed matrix has c elements;

said adjust the first bitmap based on the first compressed matrix includes change the corresponding bit values in the first bit map from 0 to 1 for said one or more elements of the first matrix that have a zero value that are moved into the first compressed matrix;

said compress the second matrix into the second compressed matrix includes:

beginning with an element located at a first row and a first column of the second matrix, move each element of the second matrix that has a non-zero value into the second compressed matrix in column major order, and when a column of the second matrix has less than c elements that have a non-zero value, move one or more elements that have a zero value into the second compressed matrix so that the corresponding column of the second compressed matrix has c elements; and said adjust the second bitmap based on the second compressed matrix includes change the corresponding bit values in the second bit map from 0 to 1 for said one or more elements of the second matrix that have a zero value that are moved into the second compressed matrix.

7. The system according to claim 6, where a first number of non-zero elements in the first matrix is equal to or less than c times m, and a second number of non-zero elements in the second matrix is equal to or less than c times p.

8. The system according to claim 1, where said compress the first matrix into the first compressed matrix is performed in place, and said compress the second matrix into the second compressed matrix is performed in place.

9. A matrix multiply accelerator (MMA), comprising:

a first scalar register to store a first bitmap associated with a first matrix, the first bitmap having a plurality of bit positions, each bit position corresponding to a different element of the first matrix, each bit position having a value of 0 when the corresponding element of the first matrix is 0, and a value of 1 when the corresponding element of the first matrix is not 0;

a first vector register to store a first compressed matrix, the first compressed matrix including fewer elements having the value of 0 than the first matrix;

a second scalar register to store a second bitmap associated with a second matrix, the second bitmap having a plurality of bit positions, each bit position corresponding to a different element of the second matrix, each bit position having a value of 0 when the corresponding element of the second matrix is 0, and a value of 1 when the corresponding element of the second matrix is not 0;

a second vector register to store a second compressed matrix, the second compressed matrix including fewer elements having the value of 0 than the second matrix;

an output vector register to store an output matrix; and an array of compute elements (CEs), coupled to the first scalar register, the first vector register, the second scalar register, the second vector register and the output register, each CE calculating a dot product of the $i^{th}$ row of the first compressed matrix and the $j^{th}$ column of the second compressed matrix, based on the first bitmap and the second bitmap, to generate an element i,j of the output matrix.

10. The matrix multiply accelerator according to claim 9, where each CE includes:

a first multiplexer to receive a row of the first compressed matrix, the row including a plurality of first elements, and to selectively output each of the first elements of the row based on a first data selection signal;

a second multiplexer to receive a column of the second compressed matrix, the column including a plurality of second elements, and to selectively output each of the second elements of the column based on a second data selection signal;

a data selection circuit, coupled to the first multiplexer and the second multiplexer, to receive the first bitmap and the second bitmap, to generate the first data selection signal based on the first bitmap, and to generate the second data selection signal based on the second bitmap;

a multiplier circuit, coupled to the first multiplexer and the second multiplexer, to receive the first elements selectively output by the first multiplexer and the second elements selectively output by the second multiplexer, to multiply respective first elements and second elements to generate respective intermediate products, and to output the respective intermediate products; and an accumulator circuit, coupled to the multiplier circuit, to receive the respective intermediate products, and to accumulate the respective intermediate products into a value for one element of the output matrix.

11. The matrix multiply accelerator according to claim 9, where:
the first matrix has m rows and n columns, the first compressed matrix has m rows and c columns, and n is a multiple of c;
the second matrix has n rows and p columns, and the second compressed matrix has c rows and p columns;
the output matrix has m rows and p columns; and
i goes from 1 to m, and j goes from 1 to p.

12. The matrix multiply accelerator according to claim 11, where said calculate the dot product of the $i^{th}$ row of the first compressed matrix and the $j^{th}$ column of the second compressed matrix based on the first bitmap and the second bitmap includes:
when the bit position in the first bitmap corresponding to an element i,k of the $i^{th}$ row of the first compressed matrix has the value of 1 and when the bit position in the second bitmap corresponding to an element k,j of the $j^{th}$ column of the second compressed matrix has the value of 1, multiplying the element i,k and the element k,j to generate an intermediate product;
when the bit position in the first bitmap corresponding to an element i,k of the $i^{th}$ row of the first compressed matrix has the value of 0 or when the bit position in the second bitmap corresponding to an element k,j of the $j^{th}$ column of the second compressed matrix has the value of 0, not multiplying the element i,k and the element k,j; and
accumulating the intermediate products to generate the element i,j,
where k goes from 1 to c.

13. The matrix multiply accelerator according to claim 12, where a first number of non-zero elements in the first matrix is equal to or less than c times m, and a second number of non-zero elements in the second matrix is equal to or less than c times p.

14. A computer-based method for multiplying matrices, comprising:
at a processor coupled to a memory:
generating a first bitmap based on a first matrix, the first bitmap having a plurality of bit positions, each bit position corresponding to a different element of the first matrix, each bit position having a value of 1 when a value of the corresponding element of the first matrix is not 0, and a value of 0 when the value of the corresponding element of the first matrix is 0;
compressing the first matrix into a first compressed matrix, the first compressed matrix including fewer elements having a value of 0 than the first matrix;
adjusting the first bitmap based on the first compressed matrix;
generating a second bitmap based on a second matrix, the second bitmap having a plurality of bit positions, each bit position corresponding to a different element of the second matrix, each bit position having the value of 1 when a value of the corresponding element of the second matrix is not 0, and the value of 0 when the value of the corresponding element of the second matrix is 0;
compressing the second matrix into a second compressed matrix, the second compressed matrix including fewer elements having a value of 0 than the second matrix;

adjusting the second bitmap based on the second compressed matrix; and
at a matrix multiply accelerator (MMA) coupled to the processor and the memory:
multiplying the first compressed matrix and the second compressed matrix, based on the first bitmap and the second bitmap, to generate an output matrix, including:
for each element i,j in the output matrix, calculating a dot product of the $i^{th}$ row of the first compressed matrix and the $j^{th}$ column of the second compressed matrix based on the first bitmap and the second bitmap.

15. The computer-based method according to claim 14, where:
the first matrix has m rows and n columns, the first compressed matrix has m rows and c columns, and n is a multiple of c;
the second matrix has n rows and p columns, and the second compressed matrix has c rows and p columns;
the output matrix has m rows and p columns; and
i goes from 1 to m, and j goes from 1 to p.

16. The computer-based method according to claim 15, where said calculating the dot product of the $i^{th}$ row of the first compressed matrix and the $j^{th}$ column of the second compressed matrix based on the first bitmap and the second bitmap includes:
when the bit position in the first bitmap corresponding to an element i,k of the $i^{th}$ row of the first compressed matrix has the value of 1 and when the bit position in the second bitmap corresponding to an element k,j of the $j^{th}$ column of the second compressed matrix has the value of 1, multiplying the element i,k and the element k,j to generate an intermediate product;
when the bit position in the first bitmap corresponding to an element i,k of the $i^{th}$ row of the first compressed matrix has the a value of 0 or when the bit position in the second bitmap corresponding to an element k,j of the $j^{th}$ column of the second compressed matrix has the value of 0, not multiplying the element i,k and the element k,j; and
accumulating the intermediate products to generate the element i,j,
where k goes from 1 to c.

17. The computer-based method according to claim 16, where:
said compressing the first matrix into the first compressed matrix includes:
beginning with an element located at a first row and a first column of the first matrix, moving each element of the first matrix that has a non-zero value into the first compressed matrix in row major order, and
when a row of the first matrix has less than c elements that have a non-zero value, moving one or more elements of the first matrix that have a zero value into the first compressed matrix so that the corresponding row of the first compressed matrix has c elements;
said adjusting the first bitmap based on the first compressed matrix includes changing the corresponding bit values in the first bit map, for said one or more elements of the first matrix that have a zero value, from 0 to 1;
said compressing the second matrix into the second compressed matrix includes:
beginning with an element located at a first row and a first column of the second matrix, moving each element of the second matrix that has a non-zero value into the second compressed matrix in column major order, and when a column of the second matrix has less than c elements that have a non-zero value, moving one or more elements that have a zero value into the second compressed matrix so that the corresponding column of the second compressed matrix has c elements; and said adjusting the second bitmap based on the second compressed matrix includes changing the corresponding bit values in the second bit map, for said one or more elements of the second matrix that have a zero value, from 0 to 1.

18. The computer-based method according to claim 17, where a first number of non-zero elements in the first matrix is equal to or less than c times m, and a second number of non-zero elements in the second matrix is equal to or less than c times p.

19. The computer-based method according to claim 14, where said compressing the first matrix into the first compressed matrix is performed in place, and said compressing the second matrix into the second compressed matrix is performed in place.

* * * * *